(12) United States Patent
Kim et al.

(10) Patent No.: US 12,155,784 B2
(45) Date of Patent: Nov. 26, 2024

(54) ELECTRONIC DEVICE INCLUDING CONNECTING MEMBER

(71) Applicant: Samsung Electronics Co., Ltd., Suwon-si (KR)

(72) Inventors: Seongmin Kim, Suwon-si (KR); Byunggun Jang, Suwon-si (KR); Jinyoung Bang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 113 days.

(21) Appl. No.: 17/970,969

(22) Filed: Oct. 21, 2022

(65) Prior Publication Data
US 2023/0131026 A1 Apr. 27, 2023

Related U.S. Application Data

(63) Continuation of application No. PCT/KR2022/016186, filed on Oct. 21, 2022.

(30) Foreign Application Priority Data

Oct. 21, 2021 (KR) ........................ 10-2021-0141064

(51) Int. Cl.
*G06F 1/16* (2006.01)
*H04M 1/02* (2006.01)

(52) U.S. Cl.
CPC ........ *H04M 1/0274* (2013.01); *G06F 1/1698* (2013.01); *H04M 1/0277* (2013.01)

(58) Field of Classification Search
CPC .................................................. G06F 1/1698
See application file for complete search history.

(56) References Cited

U.S. PATENT DOCUMENTS 10,581,153 B2 * 3/2020 Edwards .................. H04M 1/02
11,218,583 B2 * 1/2022 Lee ...................... H01Q 1/2283
(Continued)

FOREIGN PATENT DOCUMENTS

EP          4 319 110 A1    2/2024
JP      2001-052772 A       2/2001
(Continued)

OTHER PUBLICATIONS

International Search Report and Written Opinion dated Feb. 6, 2023, issued in International Patent Application No. PCT/KR2022/016186.

(Continued)

*Primary Examiner* — Adrian S Wilson
(74) *Attorney, Agent, or Firm* — Jefferson IP Law, LLP

(57) ABSTRACT

A printed circuit board module and an electronic device including the same are provided. The electronic device includes a housing including at least part thereof formed to be a conductive portion, a support member, a printed circuit board configured to be disposed on at least one surface of the support member and configured to dispose at least one electronic component thereon, and a connecting member for electrical coupling between the conductive portion of the housing and the electronic component, including a base plate and a connecting terminal. The connecting terminal includes a first portion fixed to the base plate, and a second portion coupled to the first portion and including a through hole formed thereon to be fastened to a fixing member, and the second portion may include a wing portion protruding to one direction.

20 Claims, 15 Drawing Sheets

(56) References Cited

U.S. PATENT DOCUMENTS

| | | | |
|---|---|---|---|
| 2013/0257659 A1* | 10/2013 | Darnell | H05K 1/028 |
| | | | 343/702 |
| 2014/0140021 A1 | 5/2014 | Malek et al. | |
| 2016/0064810 A1* | 3/2016 | Smith | H01Q 1/243 |
| | | | 439/862 |
| 2016/0072178 A1* | 3/2016 | Khalifa | H01Q 1/36 |
| | | | 343/702 |
| 2017/0171960 A1 | 6/2017 | Yang | |
| 2020/0375026 A1 | 11/2020 | Shim et al. | |
| 2021/0075090 A1 | 3/2021 | Yarga et al. | |

FOREIGN PATENT DOCUMENTS

| | | |
|---|---|---|
| JP | 2010-123290 A | 6/2010 |
| JP | 3213037 U | 10/2017 |
| JP | 2019-160769 A | 9/2019 |
| KR | 20-2010-0000088 U | 1/2010 |
| KR | 10-2013-0094899 A | 8/2013 |
| KR | 10-2014-0139520 A | 12/2014 |
| KR | 10-2017-0068938 A | 6/2017 |
| KR | 10-2020-0134068 A | 12/2020 |

OTHER PUBLICATIONS

European Search Report dated Oct. 9, 2024, issued in European Application No. 22884101.1.

* cited by examiner

ELECTRONIC DEVICE INCLUDING CONNECTING MEMBER

CROSS-REFERENCE TO RELATED APPLICATION(S)

This application is a continuation application, claiming priority under § 365(c), of an International application No. PCT/KR2022/016186, filed on Oct. 21, 2022, which is based on and claims the benefit of a Korean patent application number 10-2021-0141064, filed on Oct. 21, 2021, in the Korean Intellectual Property Office, the disclosures of all of which are incorporated by reference herein in their entireties.

TECHNICAL FIELD

The disclosure relates to an electronic device.

BACKGROUND ART

Along with the rapid development and increased use of electronic devices having new functions over the past several years, the electronic devices such as portable terminals become more important in people's lives. To maximize the portability and user convenience of portable terminals such as smartphones, which have become common due to the development of mobile communication technology, the demands for miniaturization and reduced weights are increasing, and components are integrated in a small space, for high performance.

Further, to provide a service of stable quality under a commercialized wireless communication network environment, an antenna device included in an electronic device may have to satisfy a high gain and wide beam coverage. In addition to legacy mobile communication (e.g., 2nd generation (2G)/3rd generation (3G)/4th generation (4G)/universal mobile telecommunication system (UMTS)/long term evolution (LTE)) in low/middle/high frequency bands at or below several GHz, which supports multiple bands, Bluetooth, wireless fidelity (Wi-Fi), near field communication (NFC), global positioning system (GPS), and ultra-wideband (UWB), millimeter wave communication in a frequency band of several tens of GHz or higher (e.g., a high-band frequency at or above 28 GHz) has recently been used to cope with the rapid increase of traffic and meet demands for increased traffic.

The above information is presented as background information only to assist with an understanding of the disclosure. No determination has been made, and no assertion is made, as to whether any of the above might be applicable as prior art with regard to the disclosure.

DISCLOSURE

Technical Problem

To apply an electronic device to the above-described mobile communication technologies, various antenna modules and/or antenna radiators may be disposed in the electronic device. According to an embodiment, at least part of an electronic device housing may be formed of a conductive material (e.g., metal), and this part may be used as an antenna radiator. To exert the antenna performance of the electronic device, various factors such as interference between antennas disposed in the electronic device, integration between supported bands, and/or appropriate distribution of the supported bands may have to be considered.

A flexible printed circuit board (FPCB)-type radio frequency (RF) cable (FRC) may be provided to electrically couple between communication-related components (e.g., a 5th generation (5G) communication module) disposed in the electronic device and the electronic device housing at least partially formed of the conductive material. The FRC may couple between parts of communication-related components (e.g., a communication module) and the housing, which are difficult to couple directly. The FRC is an FPCB into which an RF cable is formed. Compared to other RF cables, for example, a coaxial RF cable, the FRC is advantageous in terms of thickness, implementation of various designs, and implementation of a plurality of RF signals, thereby increasing spatial utilization.

The FRC may be fixed to the housing by fastening a fixing member, such as a screw, to the FRC. However, when the fixing member is fastened, a flexible portion of the FRC may be bent, torn, or separated from the housing due to the bending or tearing. In relation to a method of assembling the FRC to the housing, an automated facility using a robot may be used to prevent manual work-caused erroneous assembly and to minimize a time delay. Automation equipment generally fastens the fixing member by tightening the fixing member in one direction. For example, stress may be applied to the FRC along the fixing member rotated in one direction, and thus the FRC may be bent or torn or generate a foreign material, in the process of tightening the fixing member with a torque greater than an allowed torque during assembly.

Aspects of the disclosure are to address at least the above-mentioned problems and/or disadvantages and to provide at least the advantages described below. Accordingly, an aspect of the disclosure is to provide various embodiments for reducing stress applied to an FRC in fixing the FRC to a housing by means of a fixing member (e.g., a screw).

Additional aspects will be set forth in part in the description which follows and, in part, will be apparent from the description, or may be learned by practice of the presented embodiments.

Technical Solution

In accordance with an aspect of the disclosure, an electronic device is provided. The electronic device includes a housing including at least part thereof formed to be a conductive portion, a support member, a printed circuit board configured to be disposed on at least one surface of the support member and configured to dispose at least one electronic component thereon, and a connecting member for electrical coupling between the conductive portion of the housing and the electronic component, including a base plate and a connecting terminal. The connecting terminal may include a first portion fixed to the base plate, and a second portion coupled to the first portion and including a through hole formed thereon to be fastened to a fixing member, and the second portion may include a wing portion protruding to one direction.

In accordance with another aspect of the disclosure, an electronic device is provided. The electronic device includes a housing including a rear plate facing a first direction, a front plate facing an opposite direction of the first direction, and a side bezel structure surrounding a space between the front plate and the rear plate, and including at least part thereof formed to be a conductive portion, a support member disposed in the space, a printed circuit board configured to be disposed on at least one surface of the support member and configured to dispose at least one electronic component thereon, and a connecting member for electrical coupling between the conductive portion of the housing and the electronic component, including a base plate and a connecting terminal. The connecting terminal may include at least one feeding terminal configured to feed the conductive portion of the housing, and a grounding terminal configured to ground the connecting member to the support member. Each of the feeding terminal and the grounding terminal may include a first portion fixed to the base plate, and a second portion coupled to the first portion and including a through hole formed thereon to be fastened to a fixing member, and the second portion of the feeding terminal may include a wing portion protruding to one direction.

Advantageous Effects

According to various embodiments of the disclosure, when a flexible printed circuit board (FPCB)-type radio frequency (RF) cable (FRC) is fixed to a housing, the phenomenon that the FRC is bent or torn or generates a foreign material due to stress transferred to the FRC may be prevented or alleviated, even though a greater torque than an allowed torque is applied during fastening of a fixing member.

Other aspects, advantages, and salient features of the disclosure will become apparent to those skilled in the art from the following detailed description, which, taken in conjunction with the annexed drawings, discloses various embodiments of the disclosure.

DESCRIPTION OF THE DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

MODE FOR INVENTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
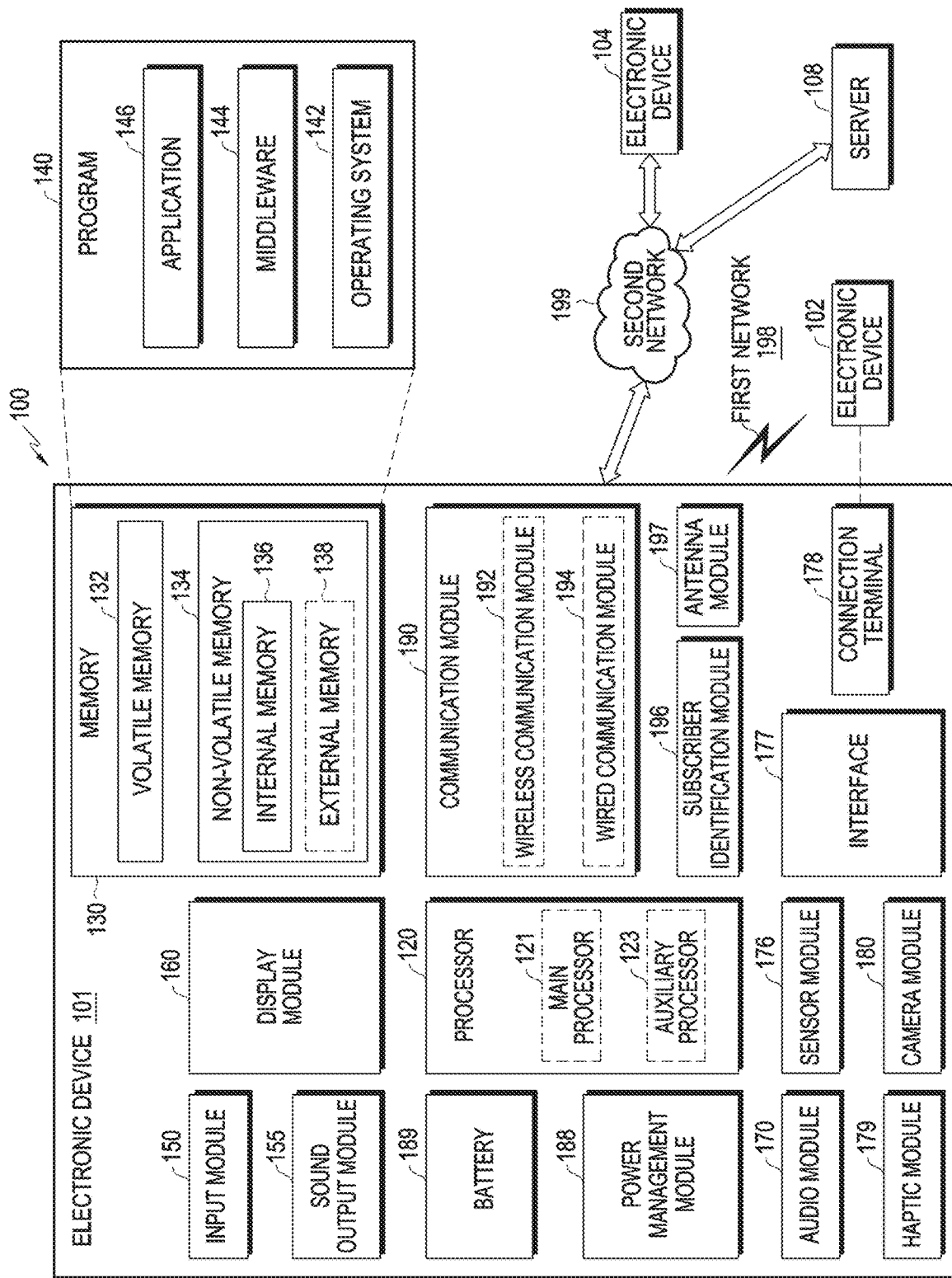
FIG. 1 is a block diagram illustrating an electronic device in a network environment according to an embodiment of the disclosure.

FIG. 1 is a block diagram illustrating an electronic device in a network environment according to an embodiment of the disclosure.

Referring to FIG. 1, an electronic device 101 in a network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In a certain embodiment, at least one of the components (e.g., the connecting terminal 178) may be omitted from the electronic device 101, or one or more other components may be added in the electronic device 101. In a certain embodiment, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) which is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors which are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™ wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form an mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102 or 104, or the server 108.

For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2A:
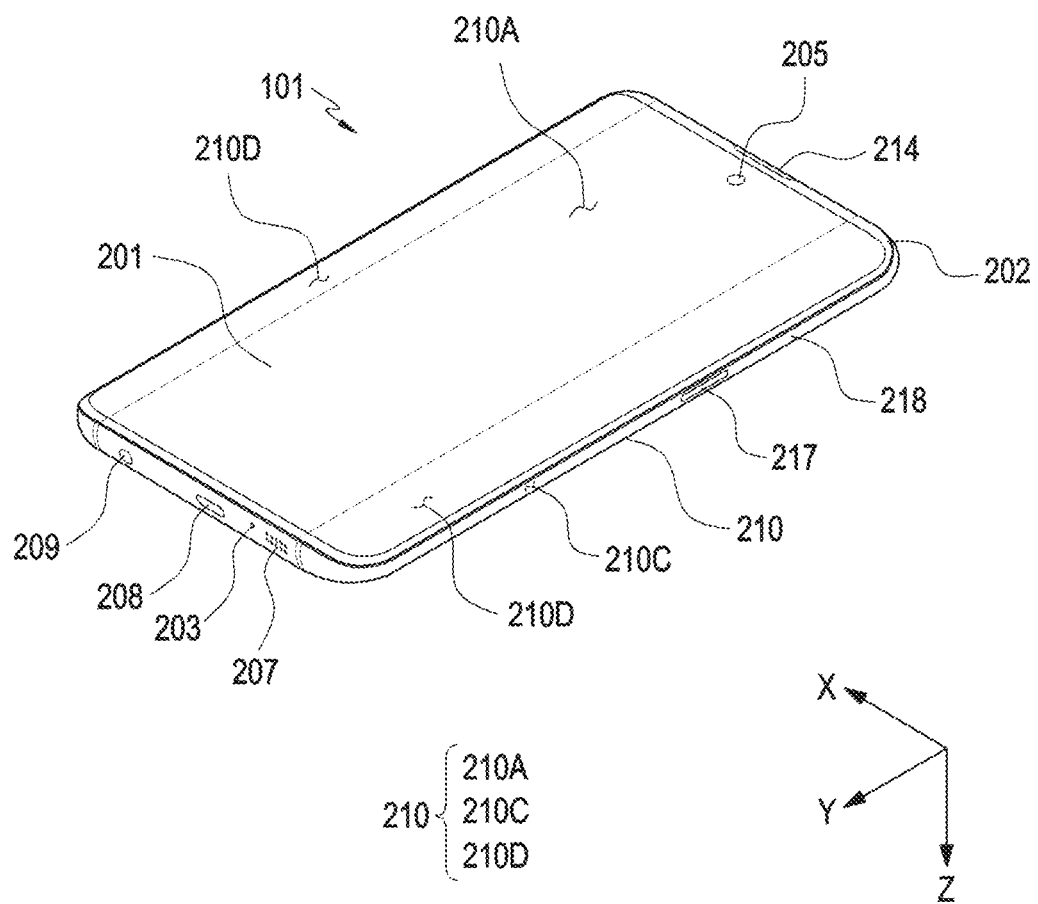
FIG. 2A is a front perspective view illustrating an electronic device according to an embodiment of the disclosure.

FIG. 2A is a front perspective view illustrating an electronic device according to an embodiment of the disclosure.

Figure 2B:
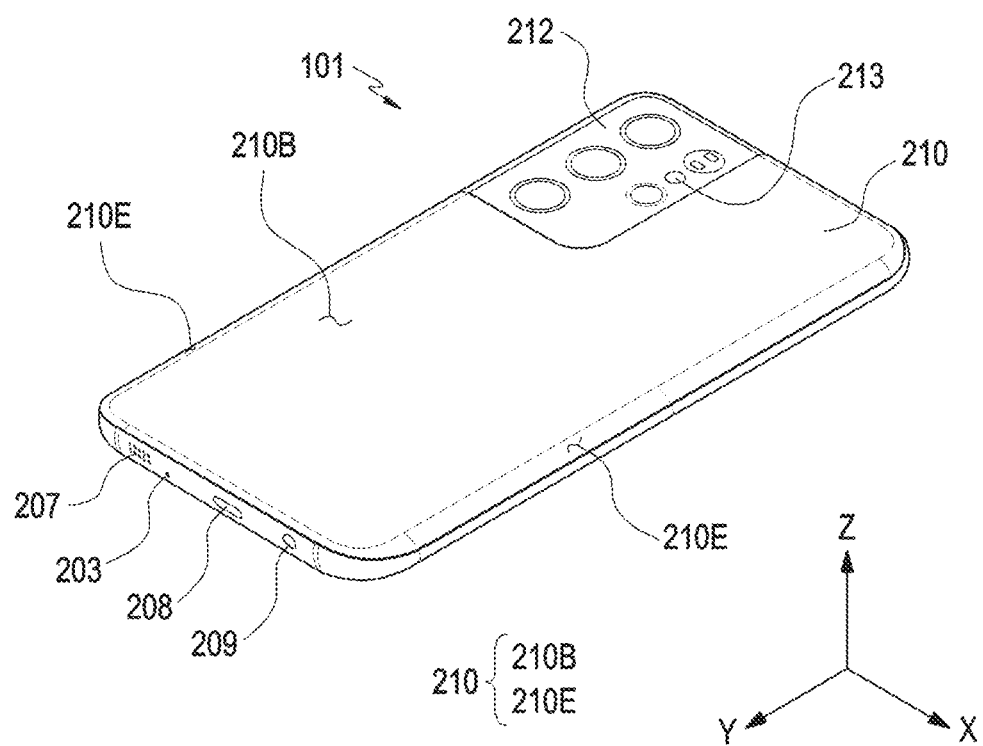
FIG. 2B is a rear perspective view illustrating an electronic device according to an embodiment of the disclosure.

FIG. 2B is a rear perspective view illustrating the electronic device according to an embodiment of the disclosure.

Referring to FIGS. 2A and 2B and the following drawings, a spatial coordinate system including an X axis, a Y axis perpendicular to the X axis, and a Z axis perpendicular to the X axis and the Y axis may be illustrated. According to various embodiments, the X axis of the spatial coordinate system may correspond to a width direction of the electronic device 101, the Y axis of the spatial coordinate system may correspond to a length direction of the electronic device 101, and the Z axis of the spatial coordinate system may correspond to a height direction of the electronic device 101.

Referring to FIGS. 2A and 2B, the electronic device 101 according to an embodiment may include a housing 210 which includes a front surface 210A, a rear surface 210B, and side surfaces 210C surrounding a space between the front surface 210A and the rear surface 210B. In an embodiment (not shown), the housing 210 may refer to a structure which forms part of the front surface 210A of FIG. 2A, the rear surface 210B of FIG. 2B, and the side surfaces 210C. According to an embodiment, at least part of the front surface 210A may be formed by a front plate 202 (e.g., a glass plate or polymer plate including various coating layers) which is at least partially substantially transparent. The rear surface 210B may be formed by a rear plate 211. The rear plate 211 may be formed of, for example, glass, ceramic, a polymer, a metal (e.g., aluminum, stainless steel (STS), or magnesium), or a combination of at least two of these materials. The side surfaces 210C may be coupled with the front plate 202 and the rear plate 211 and formed by a side bezel structure (or "side member") 218 including a metal and/or a polymer. In a certain embodiment, the rear plate 211 and the side bezel structure 218 may be integrally formed and include the same material (e.g., glass, a metal material such as aluminum, or ceramic).

In the illustrated embodiment, the front plate 202 may include two first edge regions 210D bent and extending seamlessly from the front surface 210A toward the rear plate 211, at both ends of long edges of the front plate 202. In the illustrated embodiment (refer to FIG. 2B), the rear plate 211 may include two second edge regions 210E bent and extending seamlessly from the rear surface 210B toward the front plate 202 at both ends of long edges of the rear plate 211. In a certain embodiment, the front plate 202 (or the rear plate 211) may include only one of the first edge regions 210D (or the second edge regions 210E). In an embodiment, some of the first edge regions 210D or the second edge regions 210E may not be included. In the above embodiments, when viewed from a side of the electronic device 101, the side bezel structure 218 may have a first thickness (or width) on side surfaces without the first edge regions 210D or the second edge regions 210E, and a second thickness smaller than the first thickness on side surfaces with the first edge regions 210D or the second edge regions 210E.

According to an embodiment, the electronic device 101 may include at least one of a display 201, audio modules 203, 207, and 214 (e.g., the audio module 170 of FIG. 1), a sensor module (e.g., the sensor module 176 of FIG. 1), camera modules 205 and 212 (e.g., the camera module 180 of FIG. 1), key input devices 217 (e.g., the input module 150 of FIG. 1), or connector holes 208 and 209 (e.g., the connecting terminal 178 of FIG. 1). In a certain embodiment, the electronic device 101 may not be provided with at least one (e.g., the connector hole 209) of the components or additionally include other components.

According to an embodiment, the display 201 may be visually exposed, for example, through a substantial portion of the front plate 202. In a certain embodiment, at least part of the display 201 may be exposed through the front plate 202 forming the front surface 210A and the first edge regions 210D. In a certain embodiment, the corners of the display 201 may be formed in the same shapes as those of adjacent peripheral portions of the front plate 202 on the whole. In an embodiment (not shown), the gap between the periphery of the display 201 and the periphery of the front plate 202 may be equal on the whole to increase the exposed area of the display 201.

According to an embodiment, a surface (or the front plate 202) of the housing 210 may include a view area formed by visual exposure of the display 201. For example, the view area may include the front surface 210A and the first edge regions 210D.

In an embodiment (not shown), a recess or an opening may be formed in part of the view area (e.g., the front surface 210A and the first edge regions 210D) of the display 201, and include at least one of the audio module 214, a sensor module (not shown), a light emitting element (not shown), or the camera module 205, which is aligned with the recess or the opening. In an embodiment (not shown), at least one of the audio module 214, a sensor module (not shown), the camera module 205, a fingerprint sensor (not shown), or a light emitting element (not shown) may be included on the rear surface of the view area of the display 201.

In an embodiment (not shown), the display 201 may be incorporated with or disposed adjacent to a touch sensing circuit, a pressure sensor which measures the intensity (pressure) of a touch, and/or a digitizer that detects a magnetic field-based stylus pen.

In a certain embodiment, at least some of the key input devices 217 may be disposed in the first edge regions 210D and/or the second edge regions 210E.

According to an embodiment, the audio modules 203, 207, and 214 may include a microphone hole 203 and speaker holes 207 and 214. A microphone for obtaining an external sound may be disposed in the microphone hole 203, and in a certain embodiment, a plurality of microphones may be disposed to detect the direction of a sound. The speaker holes 207 and 214 may include an external speaker hole 207 and a receiver hole 214 for calls. In a certain embodiment, the speaker holes 207 and 214 and the microphone hole 203 may be implemented as a single hole, or a speaker (e.g., a piezo speaker) may be included without the speaker holes 207 and 214. The audio modules 203, 207, and 214 may be designed in various manners such as installation of only some audio modules or addition of a new audio module according to the structure of the electronic device 101, not limited to the above structure.

According to an embodiment, a sensor module (not shown) may generate, for example, an electrical signal or data value corresponding to an internal operation state or external environmental state of the electronic device 101. The sensor module (not shown) may include, for example, a first sensor module (not shown) (e.g., a proximity sensor) and/or a second sensor module (not shown) (e.g., a fingerprint sensor), which is disposed on the front surface 210A of the housing 210, and/or a third sensor module (not shown) (e.g., a heart rate monitor (HRM) sensor) and/or a fourth sensor module (not shown) (e.g., a fingerprint sensor), which is disposed on the rear surface 210B of the housing 210. In a certain embodiment (not shown), the fingerprint sensor may be disposed on the rear surface 210B as well as on the front surface 210A (e.g., the display 201) of the housing 210. The electronic device 101 may further include a sensor module (not shown), for example, at least one of a gesture sensor, a gyro sensor, a barometric pressure sensor, a magnetic sensor, an acceleration sensor, a grip sensor, a color sensor, an IR sensor, a biometric sensor, a temperature sensor, a humidity sensor, or an illuminance sensor (not shown). The sensor module (not shown) may be designed in various manners such as installation of only some sensor modules or addition of a new sensor module according to the structure of the electronic device 101, not limited to the above structure.

According to an embodiment, the camera modules 205 and 212 may include, for example, a front camera module 205 disposed on the front surface 210A of the electronic device 101, and a rear camera module 212 and/or a flash 213 disposed on the rear surface 210B of the electronic device 101. Each of the camera modules 205 and 212 may include one or more lenses, an image sensor, and/or an image signal processor. The flash 213 may include, for example, a light emitting diode (LED) or a xenon lamp. In a certain embodiment, two or more lenses (an IR camera, a wide-angle lens, and a telephoto lens) and image sensors may be arranged on one surface of the electronic device 101. The camera modules 205 and 212 may be designed in various manners such as installation of only some camera modules or addition of a new camera module according to the structure of the electronic device 101, not limited to the above structure.

According to an embodiment, the electronic device 101 may include a plurality of camera modules (e.g., a dual camera or a triple camera) each having a different attribute (e.g., angle of view) or function. For example, a plurality of camera modules 205 and 212 including lenses having different angles of view may be configured, and the electronic device 101 may control changing of the angles of view of the camera modules 205 and 212 implemented in the electronic device 101 based on a user selection. For example, at least one of the plurality of camera modules 205 and 212 may be a wide-angle camera, and at least one other camera module may be a telephoto camera. Similarly, at least one of the plurality of camera modules 205 and 212 may be a front camera, and at least one other camera module may be a rear camera. Further, the plurality of camera modules 205 and 212 may include at least one of a wide-angle camera, a telephoto camera, or an IR camera (e.g., a time of flight (TOF) camera or a structured light camera). According to an embodiment, the IR camera may be operated as at least part of the sensor module. For example, the TOF camera may be operated as at least part of a sensor module (not shown) for detecting a distance to a subject.

According to an embodiment, the key input devices 217 may be arranged on side surfaces 210C of the housing 210. In an embodiment, the electronic device 101 may not include some or any of the above key input devices 217, and the key input devices 217 which are not included may be implemented in other forms such as soft keys on the display 201. In a certain embodiment, the key input devices may include a sensor module (not shown) disposed on the rear surface 210B of the housing 210.

According to an embodiment, a light emitting element (not shown) may be disposed, for example, on the front surface 210A of the housing 210. The light emitting element (not shown) may provide, for example, state information about the electronic device 101 in the form of light. In an embodiment, the light emitting element (not shown) may provide a light source interworking, for example, with an operation of the front camera module 205. The light emitting element (not shown) may include, for example, an LED, an IR LED, and/or a xenon lamp.

According to an embodiment, the connector holes 208 and 209 may include a first connector hole 208 which accommodates a connector (e.g., a universal serial bus (USB) connector) for transmitting and receiving power and/or data to and from an external electronic device, and/or a second connector hole 209 (e.g., an earphone jack) that may accommodate a connector for transmitting and receiving an audio signal to and from an external electronic device. The connector holes 208 and 209 may be designed in various manners such as installation of only some connector hole or addition of a new connector hole according to the structure of the electronic device 101, not limited to the above structure.

According to an embodiment, the camera module 205 and/or a sensor module (not shown) may be disposed in the internal space of the electronic device 101 to communicate with the external environment through a specified area of the display 201 and the front plate 202. For example, the specified area may be an area in which pixels are not disposed on the display 201. In another example, the specified area may be an area in which pixels are disposed on the display 201. When viewed from above the display 201, at least a part of the specified area may overlap with the camera module 205 and/or the sensor module. In another example, some sensor module may be disposed in the internal space of the electronic device to perform its function without being visually exposed through the front plate 202.

The electronic device 101 illustrated in FIGS. 2A and 2B has a bar-type or plate-type outward appearance, which should not be construed as limiting the disclosure. For example, the illustrated electronic device may be part of a rollable electronic device or foldable electronic device. A "rollable electronic device" may refer to an electronic device in which a display (e.g., the display 201 of FIG. 2A) is bendable to be deformed and thus partially wound or rolled or accommodated in a housing (e.g., the housing 210 of FIGS. 2A and 2B)). According to a user need, the rollable electronic device may increase a view area by unfolding the display or exposing a larger area of the display to the outside. A "foldable electronic device" may refer to an electronic device in which a display is foldable such that two different areas of the display face each other or in opposite directions. In general, the display may be folded with two different areas facing each other or in opposite directions in a portable state, whereas the user may unfold the display with the two different areas of the display being substantially flat in an actual use state, in the foldable electronic device. In a certain embodiment, the electronic device 101 according to various embodiments of the disclosure may be interpreted as including not only a portable electronic device such as a smartphone, but also various other electronic devices such as a laptop computer or a home appliance.

Figure 3:
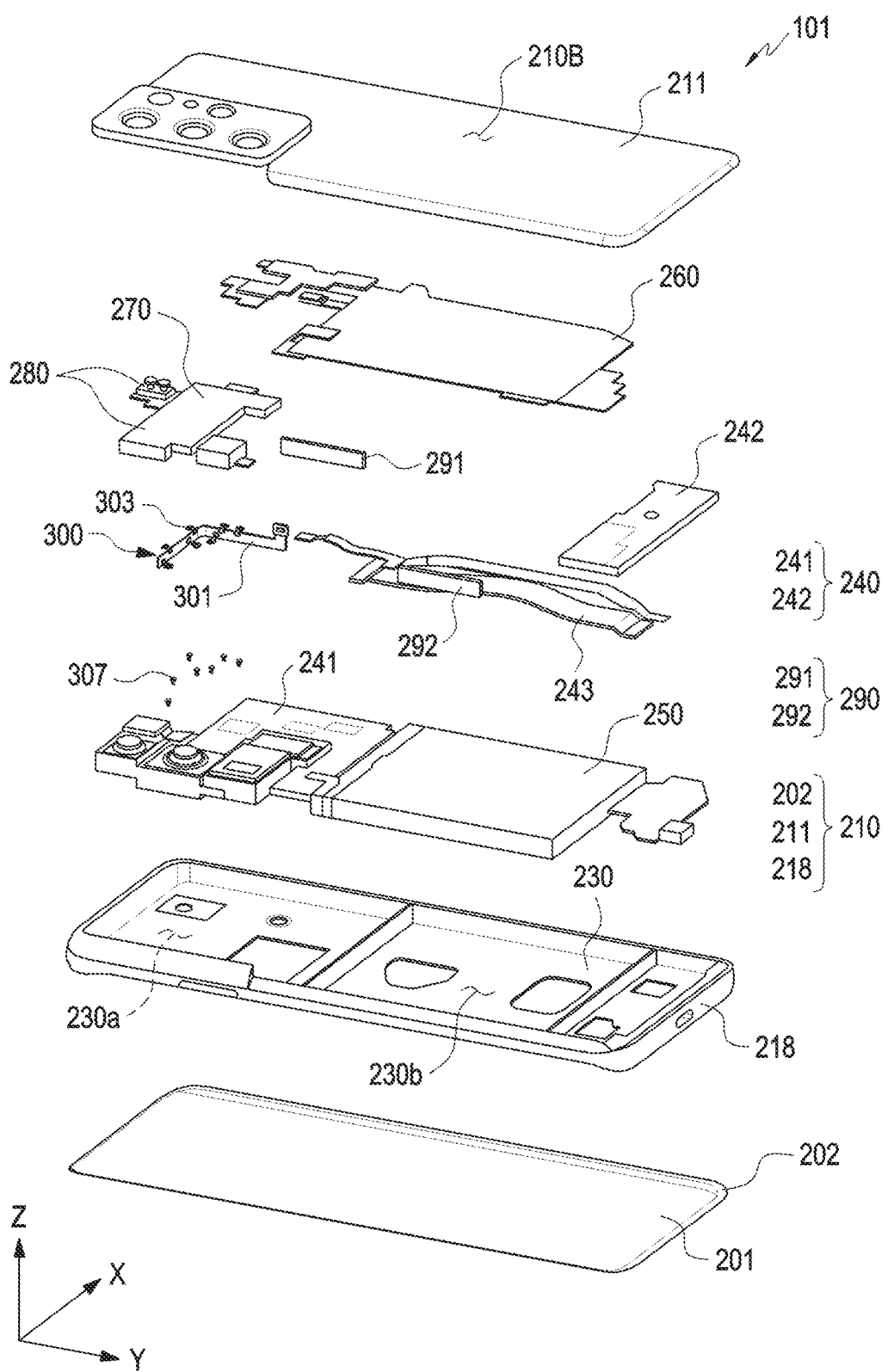
FIG. 3 is an exploded perspective view illustrating an electronic device according to an embodiment of the disclosure.

FIG. 3 is an exploded perspective view illustrating an electronic device according to an embodiment of the disclosure.

Referring to FIG. 3, the electronic device 101 may include the front plate 202, a support member (or a first support member) 230 (e.g., a bracket), a printed circuit board (PCB) 240, a battery 250, an antenna 260, a second support member 270 (e.g., a clad metal (SUS/Cu/SUS layer) material), and the rear plate 211. In a certain embodiment, the electronic device 101 may not be provided with at least one of the components or may further include other components.

According to an embodiment, the support member 230 may be disposed inside the electronic device 101 and coupled to the side bezel structure 218 or integrally formed with the side bezel structure 218. The side bezel structure 218 is shown as integrally formed with the support member 230 in FIGS. 2A and 2B. The support member 230 may be formed over an area corresponding to the display 201, and may have one surface 230a coupled to the display 201 and the other surface 230b coupled to the PCB 240. The support member 230 may include a rigid portion to support at least part of the PCB 240. The support member 230 may be formed of, for example, a metal material and/or a non-metal (e.g., polymer) material.

The PCB 240 may have various components 280, for example, a processor, memory, and/or an interface mounted thereon.

According to an embodiment, the processor (e.g., the processor 120 of FIG. 1) may include, for example, at least one of a central processing unit (CPU), an application processor, a graphic processing unit, an image signal processor, a sensor hub processor, or a communication processor. According to an embodiment, the memory may include, for example, volatile memory or non-volatile memory. According to an embodiment, the interface may include, for example, an HDMI, a USB interface, an SD card interface, and/or an audio interface. The interface may electrically or physically couple, for example, the electronic device 101 to an external electronic device, and may include a USB connector, an SD card/multimedia card (MMC) connector, or an audio connector.

According to various embodiments, the PCB 240 may include a first PCB 241 (a main PCB) disposed on one side of the battery 250 and a second PCB 242 (e.g., an auxiliary PCB) disposed at a different position from the first PCB 241 through division of a space inside the housing 210. While the PCB 240 is shown as divided into two boards (e.g., the first PCB 241 and the second PCB 242) in FIG. 3, the PCB 240 is not limited to this division. The PCB 240 may also be divided into three or more boards. A plurality of boards (e.g., the first PCB 241 and the second PCB 242) and/or electronic components disposed on the boards may be electrically coupled to each other through a connecting member 243.

According to an embodiment, the battery 250 is a device to supply power to at least one component of the electronic device 101, and may include, for example, a non-rechargeable primary cell, a rechargeable secondary cell, or a fuel battery. The battery 250 may be accommodated inside the housing, and at least part of the battery 250 may be disposed on the substantially same plane with, for example, the PCB 240. According to an embodiment, the battery 250 may be integrally disposed inside the electronic device 101. According to an embodiment, the battery 250 may be disposed detachably from the electronic device 101.

According to an embodiment, the antenna 260 may be disposed between the rear plate 211 and the battery 250. The antenna 260 may include, for example, a near field communication (NFC) antenna, a wireless charging antenna, and/or a magnetic secure transmission (MST) antenna. The antenna 260 may, for example, perform short-range communication with an external device or wirelessly transmit/receive power required for charging. In another embodiment, the support member 230, part of the side bezel structure 218, and/or a combination thereof may be formed to include an electrically conductive material (e.g., metal), thereby forming an antenna structure.

According to various embodiments of the disclosure, the electronic device may include an antenna module 290. For example, parts of the antenna module 290 may be implemented to transmit and receive radio waves having different characteristics (tentatively, referred to as radio waves in frequency bands A and B) for multiple input multiple output (MIMO) implementation. In another example, parts of the antenna module 290 may be configured to simultaneously transmit and receive, for example, radio waves having the same characteristics (tentatively, referred to as radio waves at frequencies A1 and A2 in the frequency band A) for diversity implementation. In another example, other parts of the antenna module 290 may be configured to simultaneously transmit and receive, for example, radio waves having the same characteristics (tentatively, referred to as radio waves at frequencies B1 and B2 in the frequency band B) for diversity implementation. While the electronic device 101 may include two antenna modules 291 and 292 in an embodiment of the disclosure, the electronic device 101 may include four antenna modules to simultaneously implement MIMO and diversity in another embodiment of the disclosure. In another embodiment, the electronic device 101 may include only one antenna module 290.

According to an embodiment, when one antenna module 291 is disposed at a first position of the PCB 240 in consideration of the transmission/reception characteristics of radio waves, the other antenna module 292 may be disposed at a second position separated from the first position. In another example, one antenna module and the other antenna module may be disposed in consideration of a separation distance according to diversity characteristics.

According to an embodiment, the antenna module 290 may include a wireless communication circuit which processes radio waves transmitted and received in a high frequency band (e.g., at or above 6 GHz or at or below 300 GHz). A conductive plate of the antenna module 290 may be formed of, for example, a patch-type radiation conductor or a dipole structure extending in one direction, and a plurality of conductive plates may be arrayed to form an antenna array. A chip (e.g., an integrated circuit (IC) chip) on which part of the wireless communication circuit is implemented may be disposed on one side of an area in which the conductive plate is disposed or on a surface facing the opposite direction of a surface on which the conductive plate is disposed, and may be electrically coupled to the conductive plate through a wiring of a printed circuit pattern. 5G communication using a millimeter frequency band may be performed using the antenna module 290. The electronic device 101 may use, as antenna radiators, the antenna 260, the antenna module 290, and alternatively or additionally to the antenna 260 and the antenna module 290, the housing 210 having at least part (e.g., the side bezel structure 218) formed to be a conductive portion (e.g., metal), to conduct various types of communication such as 2nd generation (2G)/3rd generation (3G)/4th generation (4G) communication, Bluetooth, wireless fidelity (Wi-Fi), and/or ultra-wideband (UWB).

When it is difficult to directly couple electronic components (e.g., the first communication module 190 of FIG. 1) which performs various required functions to the side bezel structure 218 in implementing the various communication schemes, the electronic device 101 may further include a connecting member 300 for electrical coupling between the conductive portion of the housing and the electronic components.

According to an embodiment, the connecting member 300 may include a base plate 301 forming the overall shape of the connecting member 300, and a connecting terminal 303 coupling the base plate 301 to another component. A fixing member 307 for fixing the base plate 301 to the component may be fastened to the connecting terminal 303. A plurality of connecting terminals 303 and a plurality of fixing members 307 may be provided, and disposed at different positions along a length direction of the connecting member 300.

With reference to an embodiment illustrated in FIGS. 4, 5 and 6, a more detailed description will be given below of the connecting member 300.

Figure 4:
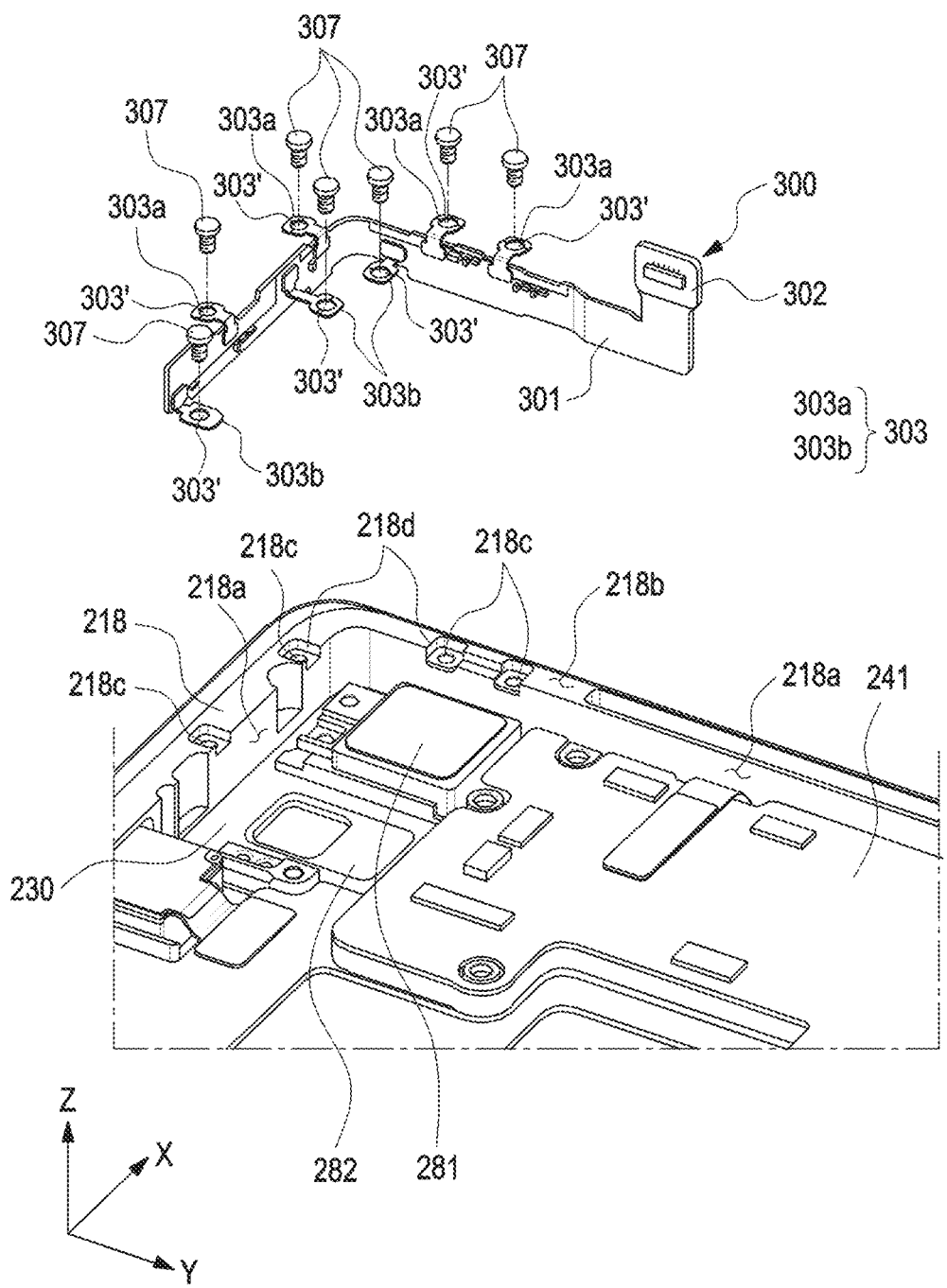
FIG. 4 is a diagram illustrating an interior of an electronic device including a connecting member according to an embodiment of the disclosure.

FIG. 4 is a diagram illustrating the interior of an electronic device including a connecting member according to an embodiment of the disclosure.

Figure 5:
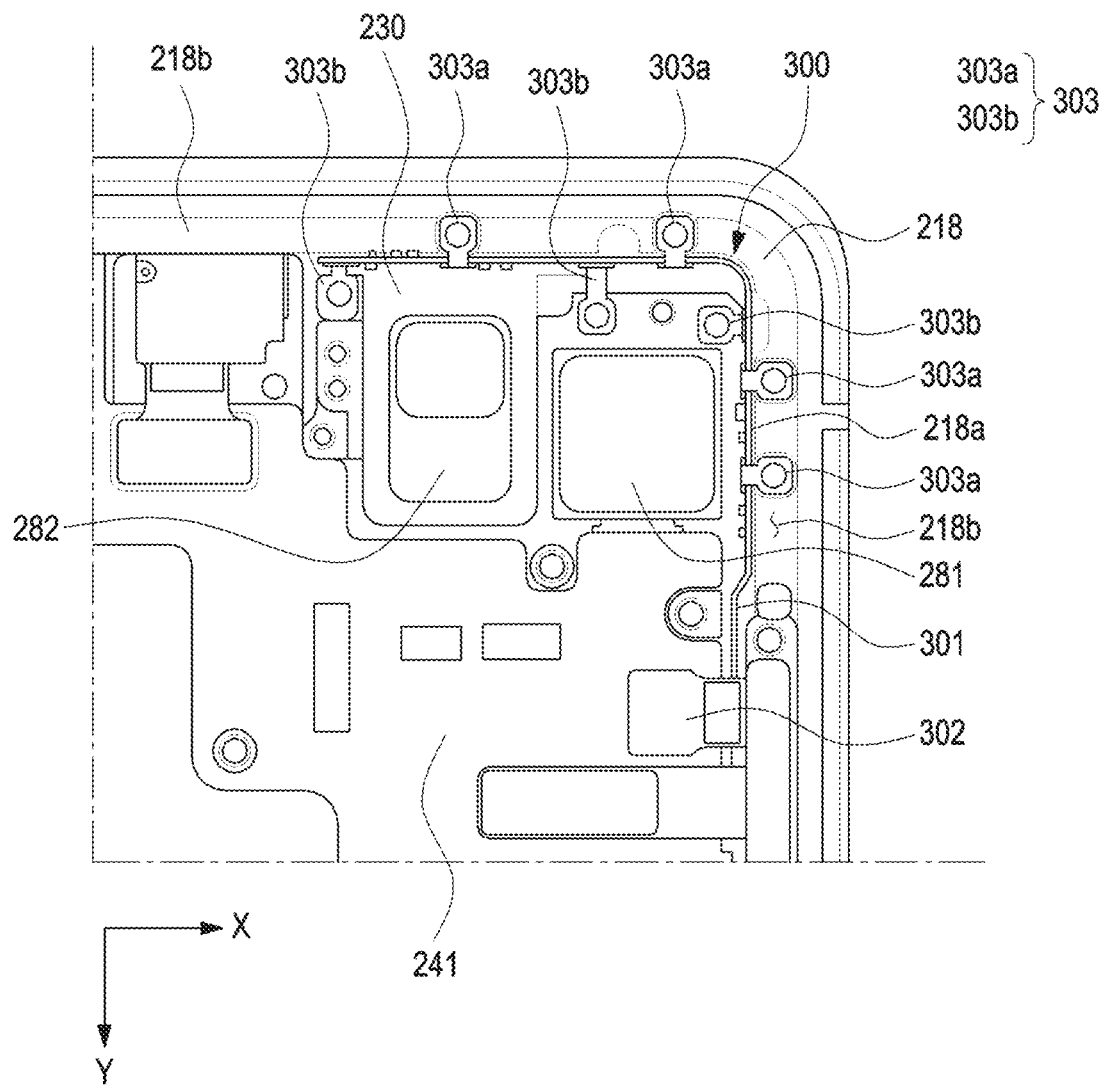
FIG. 5 is a diagram illustrating a connecting member disposed in a housing of an electronic device according to an embodiment of the disclosure.

FIG. 5 is a diagram illustrating the connecting member 300 disposed in a housing (e.g., the side bezel structure 218) of an electronic device according to an embodiment of the disclosure.

Figure 6:
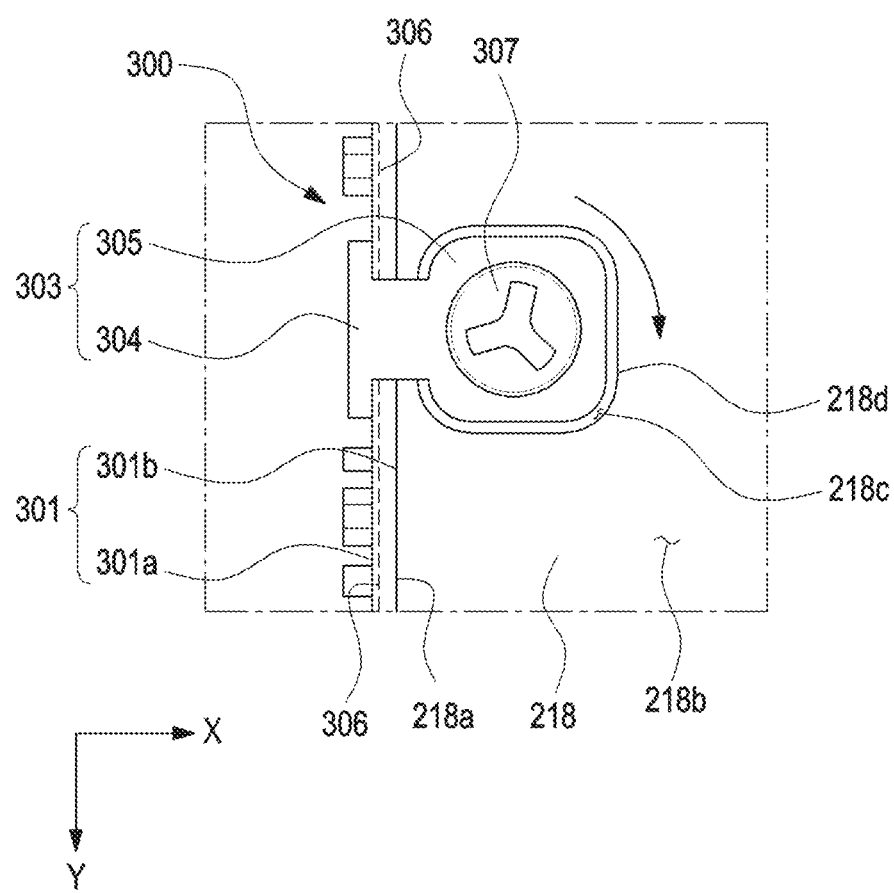
FIG. 6 is an enlarged view illustrating an arrangement relationship between a connecting member and a housing according to an embodiment of the disclosure.

FIG. 6 is an enlarged view illustrating an arrangement relationship between the connecting member 300 and the housing (e.g., the side bezel structure 218) according to an embodiment of the disclosure.

Referring to FIG. 4, at least part of the connecting member 300 may be closely fixed to the inner surface of the housing (e.g., the inner surface of the side bezel structure 218 of FIG. 3). For example, the connecting member 300 may include the base plate 301 which is thin and elongated, and the base plate 301 may have a shape corresponding to at least part of a first surface 218a of the side bezel structure 218. The base plate 301 may include at least one curved portion to have the shape corresponding to the at least part of the first surface 218a of the side bezel structure 218, and may be disposed in close contact with the first surface 218a of the side bezel structure 218 during assembly of the electronic device 101. According to an embodiment, the base plate 301 may be formed of a flexible printed circuit board (FPCB). Further, according to an embodiment, the base plate 301 may be formed of an FPCB-type radio frequency (RF) cable (FRC).

Referring to FIGS. 4 and 5 together, the connecting member 300 may further include a connecting end 302 at a portion of the base plate 301. According to an embodiment, the connecting end 302 may be a portion integrally extending from the flexible base plate 301. The connecting end 302, which is a portion electrically coupled to an RF transmission line of a PCB (e.g., the first PCB 241), may be bent toward and assembled to the PCB (e.g., the first PCB 241) during the assembly of the electronic device 101. For example, while the connecting end 302 is shown as not bent from the base plate 301 in FIG. 4, the connecting end 302 is shown as bent at a predetermined angle (e.g., approximately 90 degrees) from the base plate 301 to face the PCB (e.g., the first PCB 241) in FIG. 5. According to an embodiment, at least one conductive pin may be formed on the connecting end 302 to be coupled to a component disposed on the PCB, and/or a connector.

The connecting member 300 may include the connecting terminal 303 to couple the base plate 301 to another component. "Another component" may be, for example, a conductive portion of a housing or a support member (e.g., the support member 230 of FIG. 3) (or the PCB 241) of the electronic device. A plurality of electric components 281, 282 may be disposed on the support member 230 or the PCB 241. The connecting terminal 303 may include a feeding terminal 303a and a grounding terminal 303b depending on a component to which the connecting terminal 303 couples the base plate 301. For example, the feeding terminal 303a may be a component for feeding the conductive portion of the housing, and the grounding terminal 303b may be a component for grounding the connecting member 300 to the support member 230 (or the PCB 241).

The feeding terminal 303a and the grounding terminal 303b may be distinguished from each other according to positions at which they are formed on the base plate 301. For example, the feeding terminal 303a may be formed on one side (e.g., a +Z-axis direction) of the base plate 301 in the length direction of the base plate 301, and the grounding terminal 303b may be formed on the other side (e.g., a −Z-axis direction) of the base plate 301. As illustrated in FIG. 4, as the base plate 301 is disposed on the first surface 218a of the side bezel structure 218, the base plate 301 may be disposed substantially perpendicular to the PCB (e.g., the first PCB 241) of the electronic device 101. When the base plate 301 is disposed on the first surface 218a of the side bezel structure 218, the feeding terminal 303a disposed on one side of the base plate 301 may be disposed adjacent to a top surface (e.g., a second surface 218b) of the side bezel structure 218, and the grounding terminal 303b may be disposed adjacent to the support member 230, with reference made to FIG. 4. As such, the feeding terminal 303a and the grounding terminal 303b may be disposed to be stepped in the height direction (e.g., in a −Z to +Z direction) of the electronic device 101.

Referring to FIGS. 4 and 6 together, the connecting terminal 303 (each of the feeding terminal 303a and the grounding terminal 303b) may include a first portion 304 fixed to the base plate 301 and a second portion 305 (e.g., a second portion 312 of FIG. 10) coupled to the first portion 304 and formed to have a through hole 303' thereon so that a fixing member 307 may be fastened to the second portion 305. According to an embodiment, the first portion 304 and the second portion 305 may be formed to be perpendicular to each other. When it is said that the first portion 304 and the second portion 305 are perpendicular to each other, this may not necessarily mean that the first portion 304 and the second portion 305 form an angle of 90 degrees between them. According to various embodiments, the first portion 304 of the connecting terminal 303 may face the first surface 218a of the side bezel structure 218 of the housing, and the second portion 305 of the connecting terminal 303 may face the second surface 218b of the side bezel structure 218 of the housing. For example, it may be sufficient to form the first portion 304 and the second portion 305 to be substantially parallel to the first surface 218a and the second surface 218b of the side bezel structure 218, respectively. According to an embodiment, a recess 218c may be formed on the second surface 218b of the side bezel structure 218, to mount the connecting terminal 303 therein. The recess 218c may be defined by a wall structure 218d surrounding the periphery of the connecting terminal 303, when the connecting terminal 303 is mounted. As illustrated in FIG. 6, the recess 218c may be formed to have an area corresponding to the second portion 305. The recess 218c is shown as engraved from the second surface 218b of the side bezel structure 218 in FIG. 4, which should not be construed as limiting.

A through hole 303' to which the fixing member 307 is fastened may be provided at the center of the second portion 305 of the connecting terminal 303. For example, a screw (or bolt) may correspond to the fixing member 307. For example, the screw (or bolt) may be used as an element to fix the connecting member 300 to the housing because the screw (or bolt) is easy to assemble and/or disassemble, and may be used for antenna performance tuning through tightening. While positioned in parallel with the second surface 218b of the side bezel structure 218 of the electronic device, the second portion 305 of the connecting terminal 303 may be fixedly fastened to the housing (e.g., the side bezel structure 218) of the electronic device by the fixing member 307.

According to a certain embodiment (or a comparative embodiment), when the connecting member 300 is fixed to the housing (e.g., the side bezel structure 218) of the electronic device by means the fixing member 307, the connecting member 300 and its adjacent elements may be damaged or cause a foreign material during the fastening of the fixing member 307. According to an embodiment, referring to FIG. 6, a screw (or bolt) may be used as the fixing member 307. When an excessive tightening force is applied in the process of tightening the screw (or bolt) in an arrow direction (e.g., clockwise), the other surface 301b of the connecting member 300 may be separated from the first surface 218a of the side bezel structure 218 or torn, and may cause a foreign material such as burr.

For example, when the fixing member 307 is fastened, the first portion 304 of the connecting member 300 may be bent by the force tightening the fixing member 307, and separated from the surface 218a of the size bezel structure 218. In this case, the first portion 304 of the connecting member 300 may also be bent along a rotational direction (e.g., clockwise) of the fixing member 307. According to another example, when the fixing member 307 is fastened, an RF transmission line 306 patterned on the base plate 301 may be cut off According to another example, when the fixing member 307 is fastened, a foreign material (e.g., burr) may be generated in part of the recess 218c in which the second portion 305 is disposed.

Figure 7:
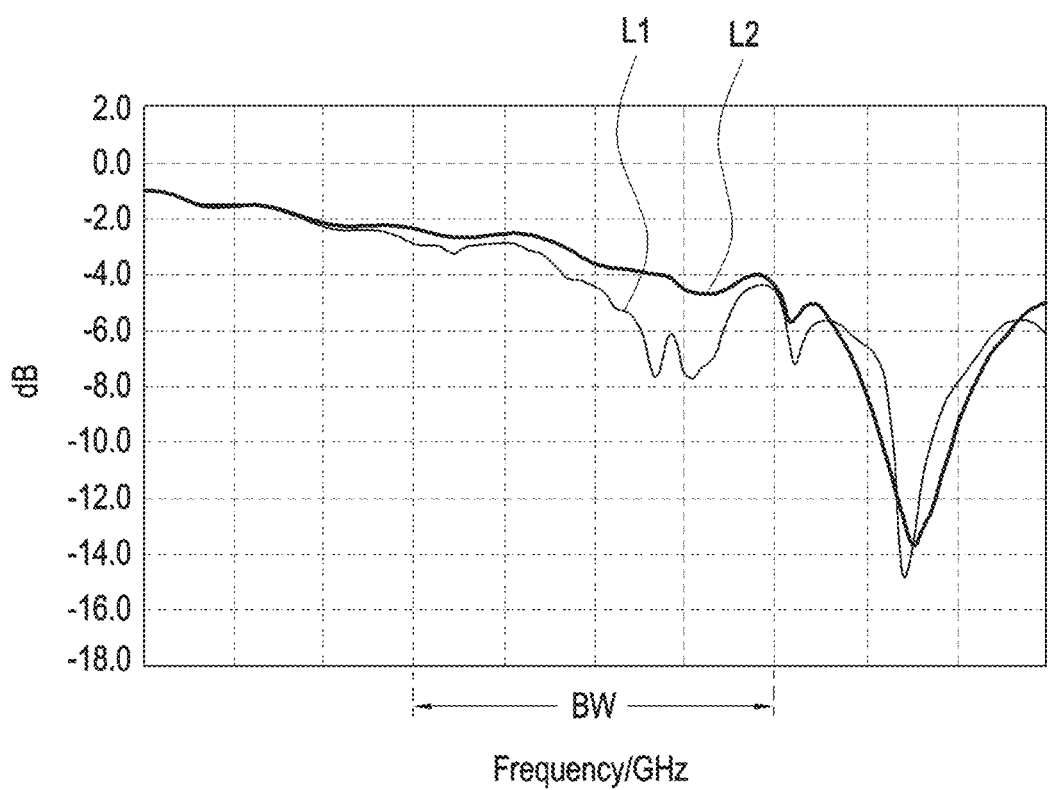
FIG. 7 is a graph illustrating a performance of an ultra-wideband (UWB) antenna in a normal state and in a connecting member separated state according to an embodiment of the disclosure.

FIG. 7 is a graph illustrating the performance of a UWB antenna in a normal state and in a separated state of a connecting member according to an embodiment of the disclosure.

Referring to FIG. 7, the X axis may represent a frequency band (frequency/GHz), and the Y axis may represent the performance of an antenna (the strength (dB) of a received signal). The normal state may refer to a state in which the connecting member 300 is neither bent nor separated from the side bezel structure.

According to the embodiment illustrated in FIG. 7, L1 denotes a curve of the UWB antenna in the normal state, and L2 denotes a curve of the UWB antenna in the separated state of the connecting member 300 (as described in the embodiment of FIG. 6). From a comparison between the curve L1 and the curve L2, it may be noted that the UWB antenna does not generate resonance in a designated frequency bandwidth (BW) in the separated state of the connecting member 300, compared to the performance of the UWB antenna in the normal state.

With reference to FIGS. 8 to 11, a structure for preventing fastening of a fixing member (e.g., a screw) from degrading antenna performance (hereinafter, referred to shortly as the "connecting member 300 including a wing-type terminal structure") according to various embodiments of the disclosure will be described in detail.

Figure 8:
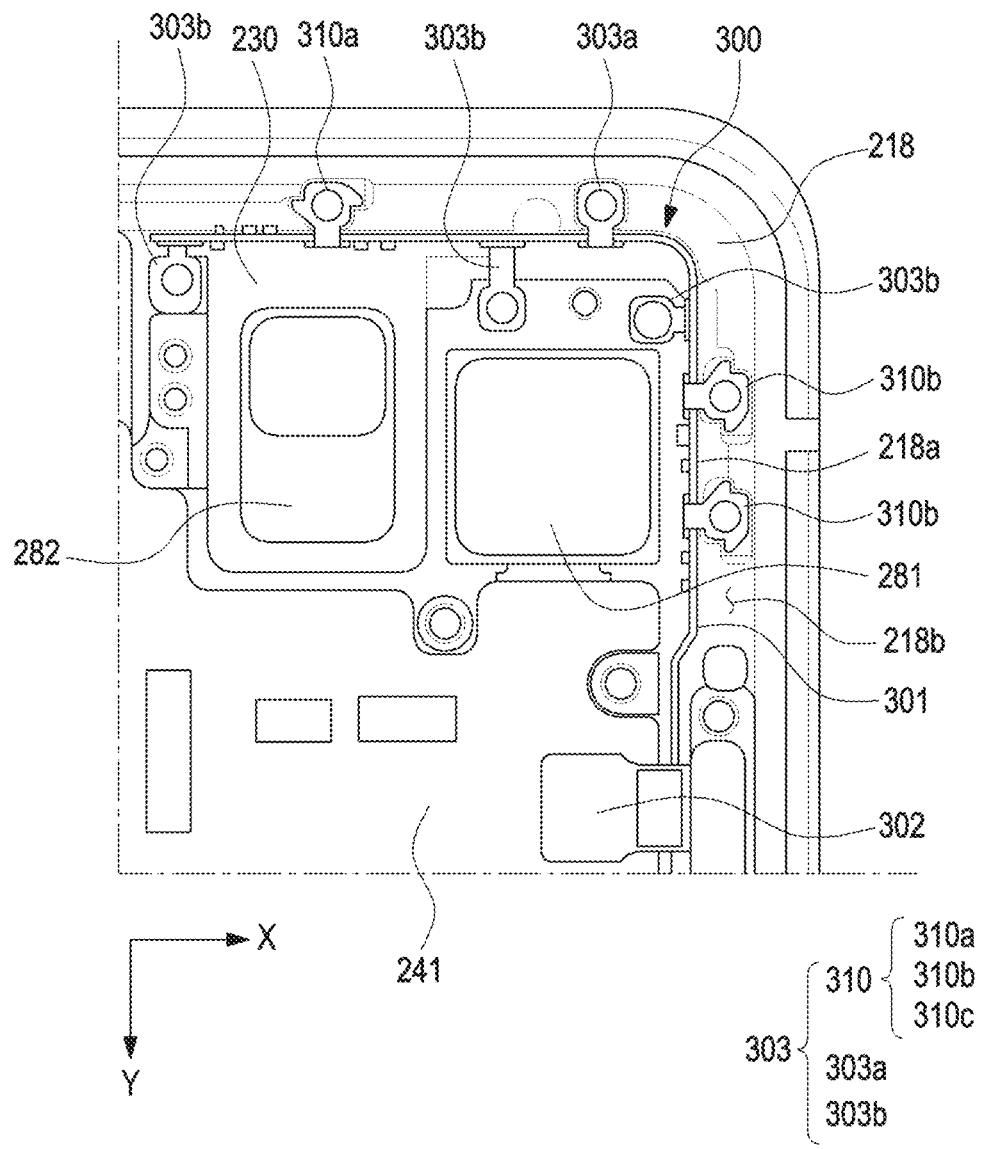
FIG. 8 is a diagram illustrating a connecting member disposed in a housing of an electronic device according to an embodiment of the disclosure.

FIG. 8 is a diagram illustrating the connecting member 300 disposed in a housing (e.g., the side bezel structure 218) of an electronic device according to an embodiment of the disclosure.

Figure 9:
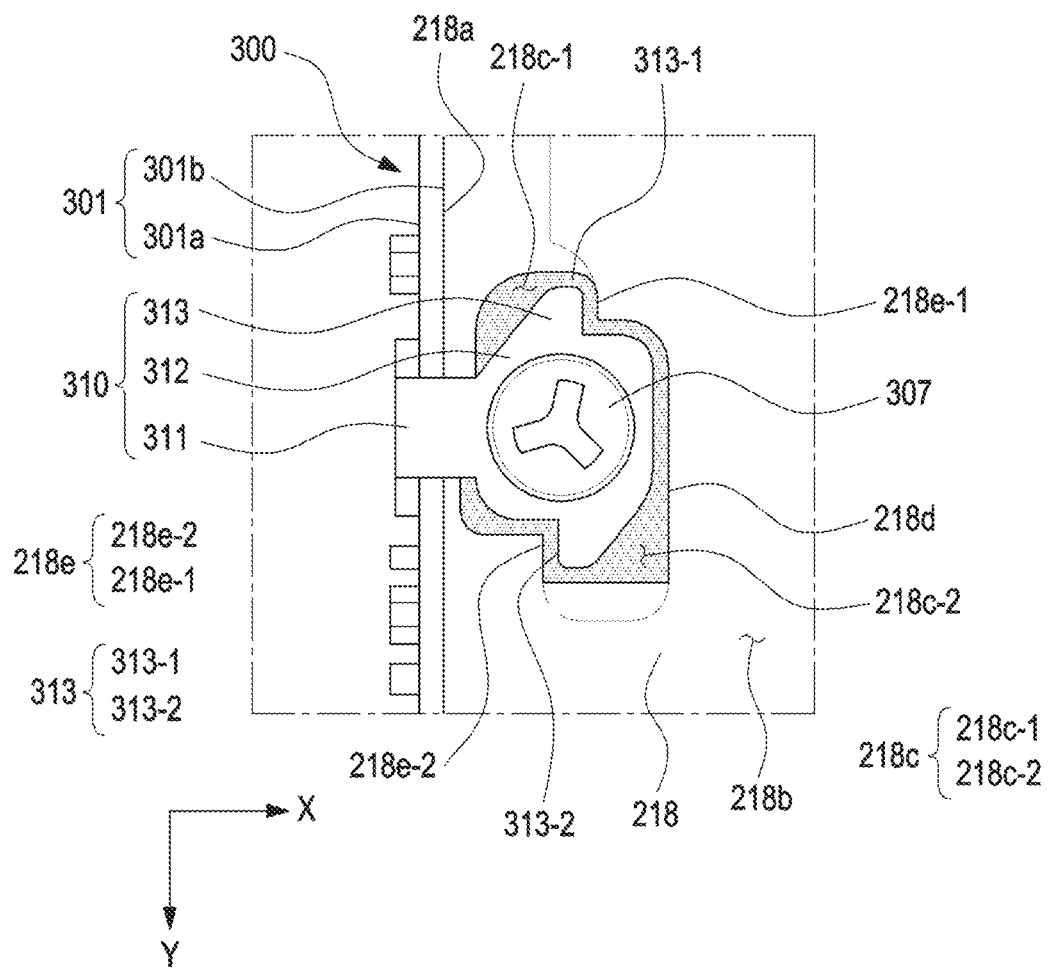
FIG. 9 is an enlarged view illustrating an arrangement relationship between a connecting member and a housing according to an embodiment of the disclosure.

FIG. 9 is an enlarged view illustrating an arrangement relationship between the connecting member 300 and the housing (e.g., the side bezel structure 218) according to an embodiment of the disclosure. In describing the embodiment of FIGS. 8 to 9, a description of the same components as those of the foregoing embodiment will be avoided.

Referring to FIG. 8, the connecting member 300 may include a feeding terminal 303a to couple the base plate 301 to the conductive portion of the housing, and a grounding terminal 303b to ground the base plate 301 to the support member 230 (or the PCB 241). Each of the feeding terminal 303a and the grounding terminal 303b may include a first portion (e.g., the first portion 304 of FIG. 6) fixed to the base plate 301, and a second portion (e.g., the second portion 305 of FIG. 6) having the through hole 303' formed thereon, so that the fixing member 307 may be fastened to the through hole 303'.

According to various embodiments of the disclosure, at least one of feeding terminals 303a may be formed as a wing-type feeding terminal 310 in the connecting member 300 including the wing-type terminal structure. According to an embodiment, the electronic device may include a plurality of wing-type feeding terminals 310. Referring to FIG. 8, the plurality of wing-type feeding terminals 310 may include first, second and third wing-type feeding terminals 310a, 310b, and 310c. According to an embodiment, the first, second and third wing-type feeding terminals 310a, 310b, and 310c may be provided to perform different communication schemes. For example, the first wing-type feeding terminal 310a may be provided for feeding to perform communication in a low band, and the second wing-type feeding terminal 310b may be provided for feeding to perform communication in mid to high frequency bands. For example, the third wing-type feeding terminal 310c may be provided for feeding to perform UWB communication (e.g., communication using a frequency of about 3 GHz to 10 GHz). However, this is only an example for performing various communication schemes, and it is to be noted that the scope of the electronic device including the wing-type feeding terminal according to various embodiments is not limited to the illustrated embodiment. According to an embodiment, feeding terminals which are not formed as wing-type feeding terminals 310 among the feeding terminals included in the connecting member 300 may be dummy feeding terminals to fix the connecting member 300 to the housing (e.g., the side bezel structure 218).

According to various embodiments of the disclosure, referring to FIG. 9, a wing-type feeding terminal 310 may include a first portion 311 (e.g., corresponding to the first portion 304 of FIG. 6) fixed to the base plate 301, and a second portion 312 (e.g., corresponding to the second portion 305 of FIG. 6) coupled to the first portion 311 and having a through hole formed thereon, so that the fixing member 307 may be fastened to the through hole. Further, the wing-type feeding terminal 310 may have a wing portion 313 formed to protrude from one side of the second portion 312. According to an embodiment, the second portion 312 may be formed parallel to the second surface 218b of the side bezel structure 218, and the wing portion 313 protruding from the one side of the second portion 312 may also be parallel to the second surface 218b of the side bezel structure 218. Referring to FIG. 9, the second portion 312 of the wing-type feeding terminal 310 according to an embodiment may include a pair of wing portions 313 symmetrical to each other with respect to the through hole. For example, the wing-type feeding terminal 310 may include a first wing portion 313-1 and a second wing portion 313-2. The wing portion 313 (e.g., the first wing portion 313-1 and the second wing portion 313-2) may be formed to protrude along the tightening direction (e.g., clockwise) of the fixing member 307. The expression "the wing portions 313 is formed to protrude along the tightening direction of the fixing member 307" may mean that a flange portion protruding to form the wing portion 313 is formed as a catching portion (e.g., hook structure) seamlessly extending from the second portion 312 in the tightening direction (e.g., clockwise) of the fixing member 307 and then extending approximately vertically toward the center of the through hole.

According to various embodiments of the disclosure, the housing may include the wall structure 218d which restricts rotation of the wing portions 313. In the embodiment of FIG. 9, the wall structure 218d may define the recess 218c to mount the second portion 312 of the wing-type feeding terminal 310 therein, while being used as a means to restrict the rotation of the wing portions 313, unlike the embodiment described above in FIG. 6. According to an embodiment, the wall structure 218d may include a stepped portion 218e corresponding to the catching portion of a wing portion 313. According to an embodiment, when the wing-type feeding terminal 310 includes a single pair of wing portions 313-1 and 313-2, the stepped portion 218e may also include a pair of stepped portions 218e-1 and 218e-2.

According to an embodiment, at least part of the wall structure 218d according to various embodiments of the disclosure may be formed to correspond to the shapes of the wing portions 313. For example, as illustrated in FIG. 9, the first stepped portion 218e-1 may be formed to include a curve in correspondence with the shape of a rounded end of the first wing portion 313-1. However, various embodiments of the disclosure are not limited to the above-described embodiment, and unlike the drawing, the second stepped portion 218e-2 may be formed in a shape corresponding to the second wing portion 313-1 (to include a curve), or both the first stepped portion 218e-1 and the second stepped portion 218e-2 may be formed in shapes corresponding to the first wing portion 313-1 and the second wing portion 313-2, respectively.

According to an embodiment, the single pair of stepped portions 218e-1 and 218e-2 may include a first stepped portion 218e-1 and a second stepped portion 218e-2. The first stepped portion 218e-1 and the second stepped portion 218e-2 may be formed to have a specific step difference toward the recess 218c and in a first direction (e.g., the Z-axis direction of FIG. 3). According to an embodiment, referring to FIG. 9, applying the wing-type feeding terminal 310 may bring the effect of increased exposed areas 218c-1 and 218c-2 of the recess 218c to the side bezel structure 218.

According to an embodiment, the side bezel structure 218 may be formed to have a conductive portion (e.g., a metal). For example, the recess 218c of the side bezel structure 218 may form an externally exposed conductive portion. According to this, the side bezel structure 218 may increase the exposed areas 218c-1 and 218c-2 of the recess 218c as the effect of applying the wing-type feeding terminal 310. In addition, a wider area of the conductive portion may be contactable with the wing-type feeding terminal 310, thereby forming a stable electrical coupling structure. According to various embodiments of the disclosure, even when a tightening force greater than an allowed force is applied to the fixing member 307 during fastening of the fixing member 307, rotation of the fixing member 307 may be restricted by the wall structure 218d owing to the use of the wing-type feeding terminal 310. Therefore, various embodiments of the disclosure including the wing-type feeding terminal 310 may prevent the force (tightening force) which tightens the fixing member (e.g., screw) 307 during fastening of the fixing member 307 from bending the connecting member 300 or separating the connecting member 300 from the side bezel structure 218.

The embodiment of FIG. 9 has been described above, focusing on the wing-type feeding terminal 310 including a pair of wing portions 313-1 and 313-2 of the same shape, which should not be construed as limiting. For example, the wing-type feeding terminal 310 may include one wing portion or three or more wing portions. When the wing-type feeding terminal 310 includes a plurality of wing portions, at least one wing portion may be formed in a different shape from that of another wing portion.

Figure 10:
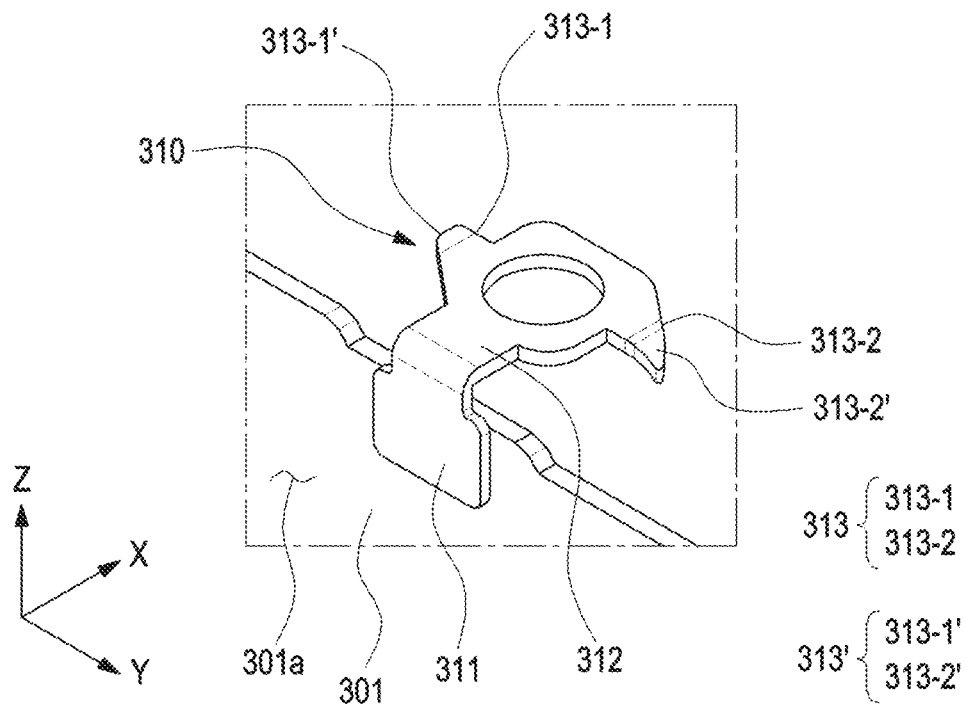
FIG. 10 is a diagram illustrating a wing-type feeding terminal further including a bending portion according to an embodiment of the disclosure.

FIG. 10 is a diagram illustrating a wing-type feeding terminal further including a bending portion according to an embodiment of the disclosure.

Figure 11:
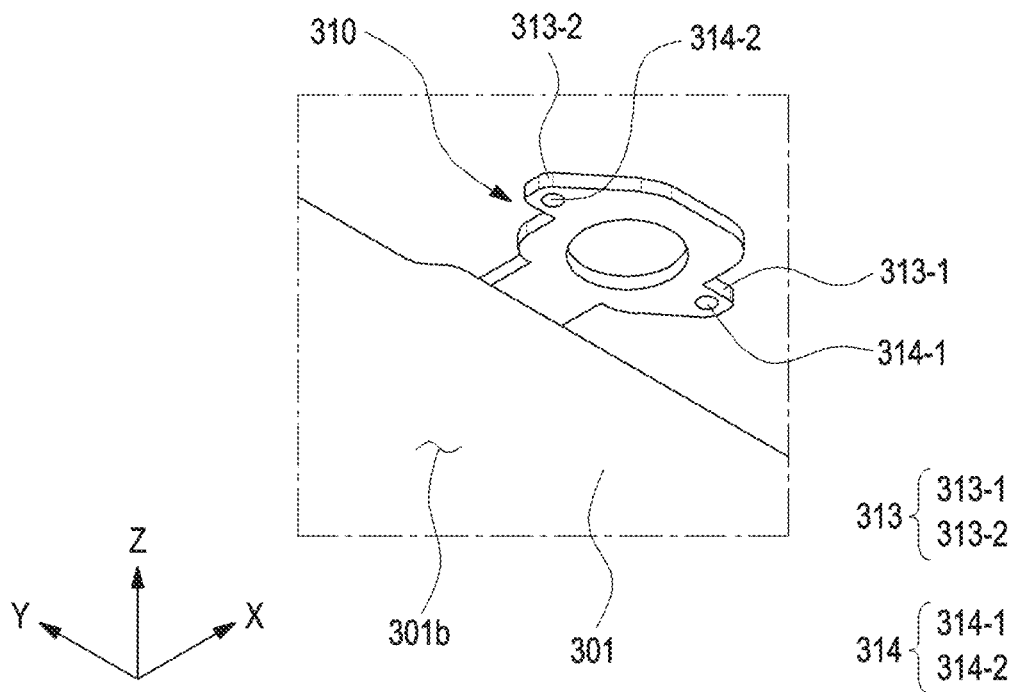
FIG. 11 is a diagram illustrating a wing-type feeding terminal further including an embossed portion according to an embodiment of the disclosure.

FIG. 11 is a diagram illustrating a wing-type feeding terminal further including embossed protrusions according to an embodiment of the disclosure.

Referring to FIG. 10, the wing-type feeding terminal 310 may include a bending portion 313' bent toward the rear surface of a wing portion 313. According to an embodiment, when the wing-type feeding terminal 310 includes a pair of wing portions 313-1 and 313-2, a pair of bending portions 313-1' and 313-2' may be provided. As the wing-type feeding terminal 310 further includes the bending portion 313', conductivity between the feeding terminal and the conductive portion of the side bezel structure 218 may be increased, and a short circuit may be prevented.

Referring to FIG. 11, the wing-type feeding terminal 310 may include a protrusion 314 formed on the rear surface of a wing portion 313. According to an embodiment, when the wing-type feeding terminal 310 includes a pair of wing portions 313, the protrusion 314 may include a pair of protrusions 314-1 and 314-2. Since the wing-type feeding terminal 310 further includes the protrusion 314, the wing portion 313 and the recess 218c may be easily brought into contact. For example, as the wing-type feeding terminal 310 includes the protrusion 314, conductivity between the feeding terminal and the conductive portion of the side bezel structure 218 may be increased, and a short circuit may be prevented. Referring to FIGS. 9 and 11 together, when the recess 218c of the wing-type feeding terminal 310 has the increased exposed areas 218c-1 and 218c-2, and thus the protrusion 314 and the recess 218c contact over a wide area, a signal transmission contact point may be maintained more stably.

Figure 12:
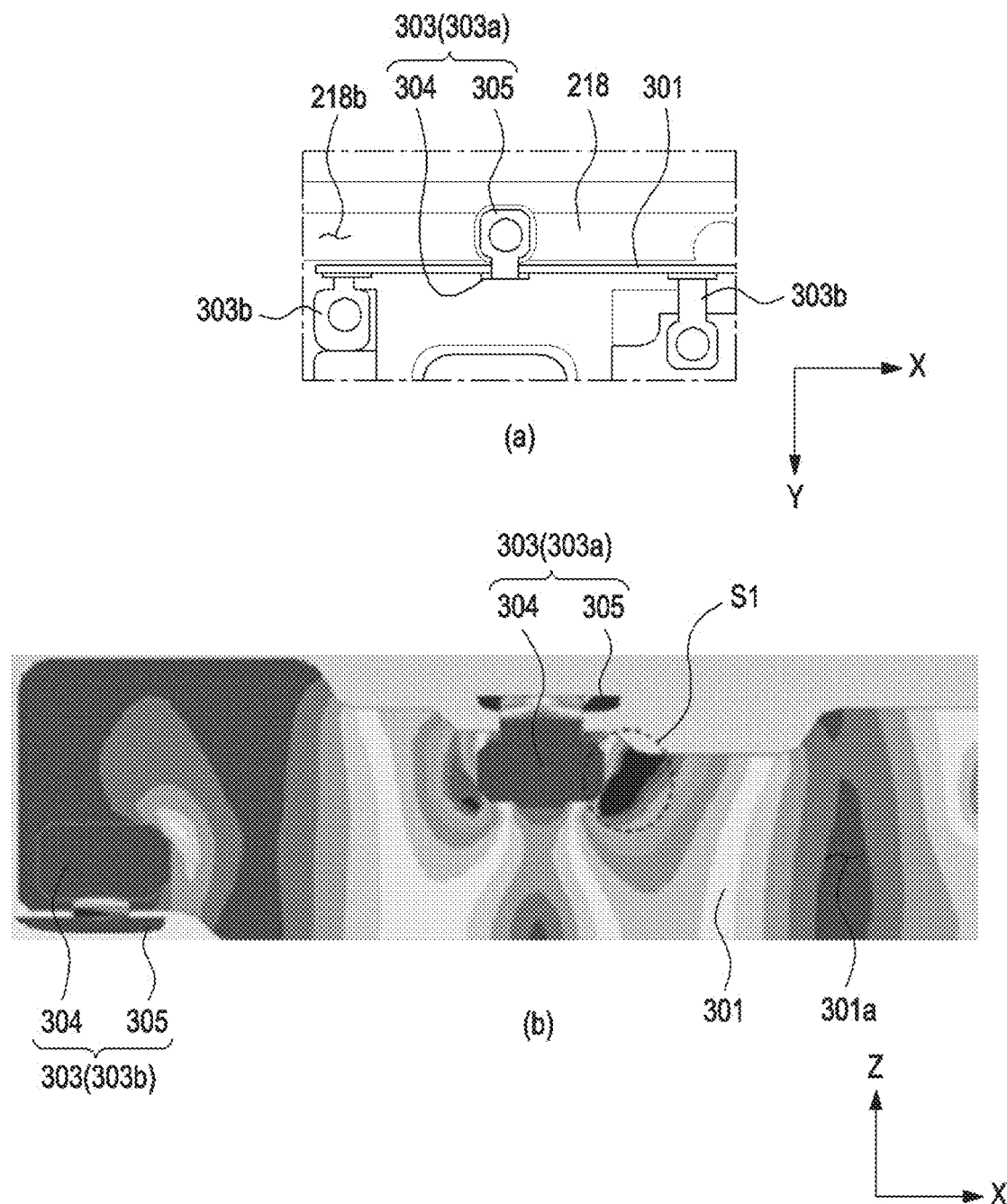
FIG. 12 is a diagram illustrating a simulation result of stress acting on a base plate, when a fixing member is fastened to a connecting terminal according to an embodiment of the disclosure.

FIG. 12 is a diagram illustrating a simulation result of stress acting on a base plate, when a fixing member is fastened to a feeding terminal according to an embodiment of the disclosure.

Figure 13:
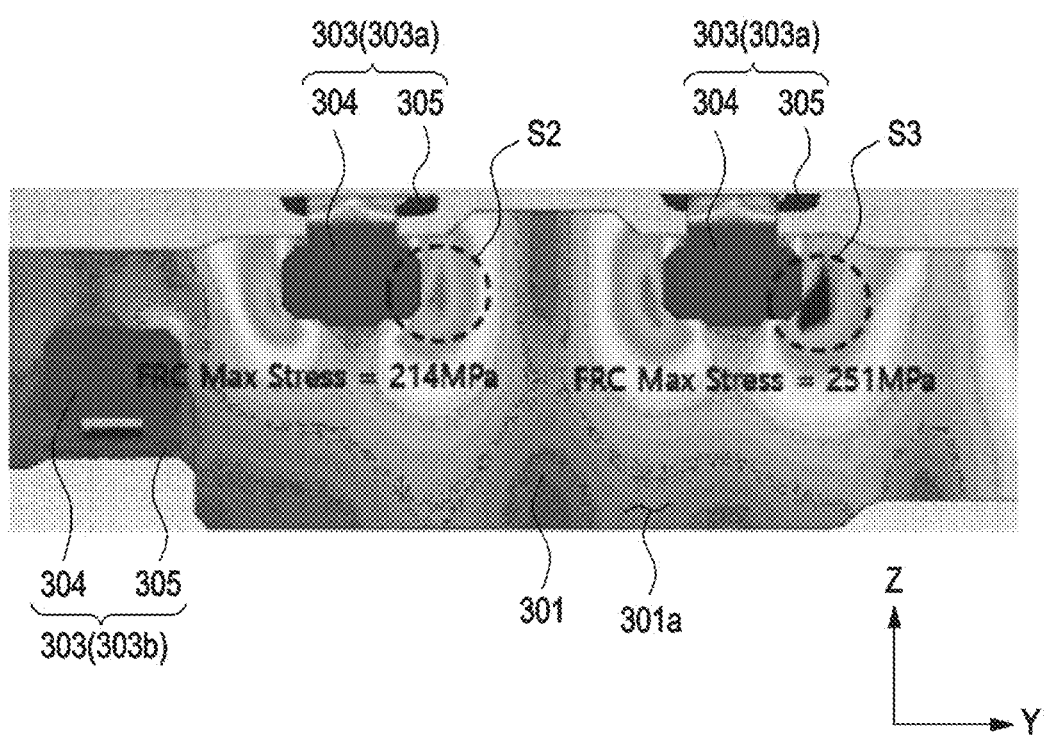
FIG. 13 is a diagram illustrating a simulation result of stress acting on a base plate, when a fixing member is fastened to each of connecting terminals according to an embodiment of the disclosure.

FIG. 13 is a diagram illustrating a simulation result of stress acting on a base plate, when fixing members are fastened to feeding terminals, respectively according to an embodiment of the disclosure.

Part (a) of FIG. 12 may be a top view illustrating the side bezel structure 218 in a state in which a fixing member is fastened to a feeding terminal 303a, and part (b) of FIG. 12 may be a side view illustrating the side bezel structure 218 in the state in which the fixing member is fastened to the feeding terminal 303a. FIG. 13 may be a side view illustrating the side bezel structure 218 in a state in which fixing members are fastened to feeding terminals 303a.

FIG. 12 may illustrate a simulation result of stress acting on the base plate 301 to which the feeding terminal 303a is fastened to implement a first communication scheme (e.g., low band) among a plurality of connecting terminals according to a certain embodiment (or comparative embodiment). According to an embodiment, stress acting around the feeding terminal 303a on the base plate 301 may be identified by measuring residual stress on the base plate 301. FIG. 12 may illustrate that residual stress of a high value, for example, 112 MPa exists on the base plate 301 around the feeding terminal (e.g., in a region S1). FIG. 13 illustrates another embodiment (comparative embodiment) different from the example illustrated in FIG. 12, for example, a simulation result of stress acting on the base plate 301, when fastening members are fastened to feeding terminals 303a for implementing a second communication scheme (e.g., mid/high band) and a third communication scheme (e.g., UWB) among a plurality of connecting terminals. Referring to FIG. 13, it may be noted that residual stress of high values, for example, 214 MPa and 251 MPa exists on the base plate 301 around the feeding terminal (e.g., in regions S2 and S3).

Figure 14:
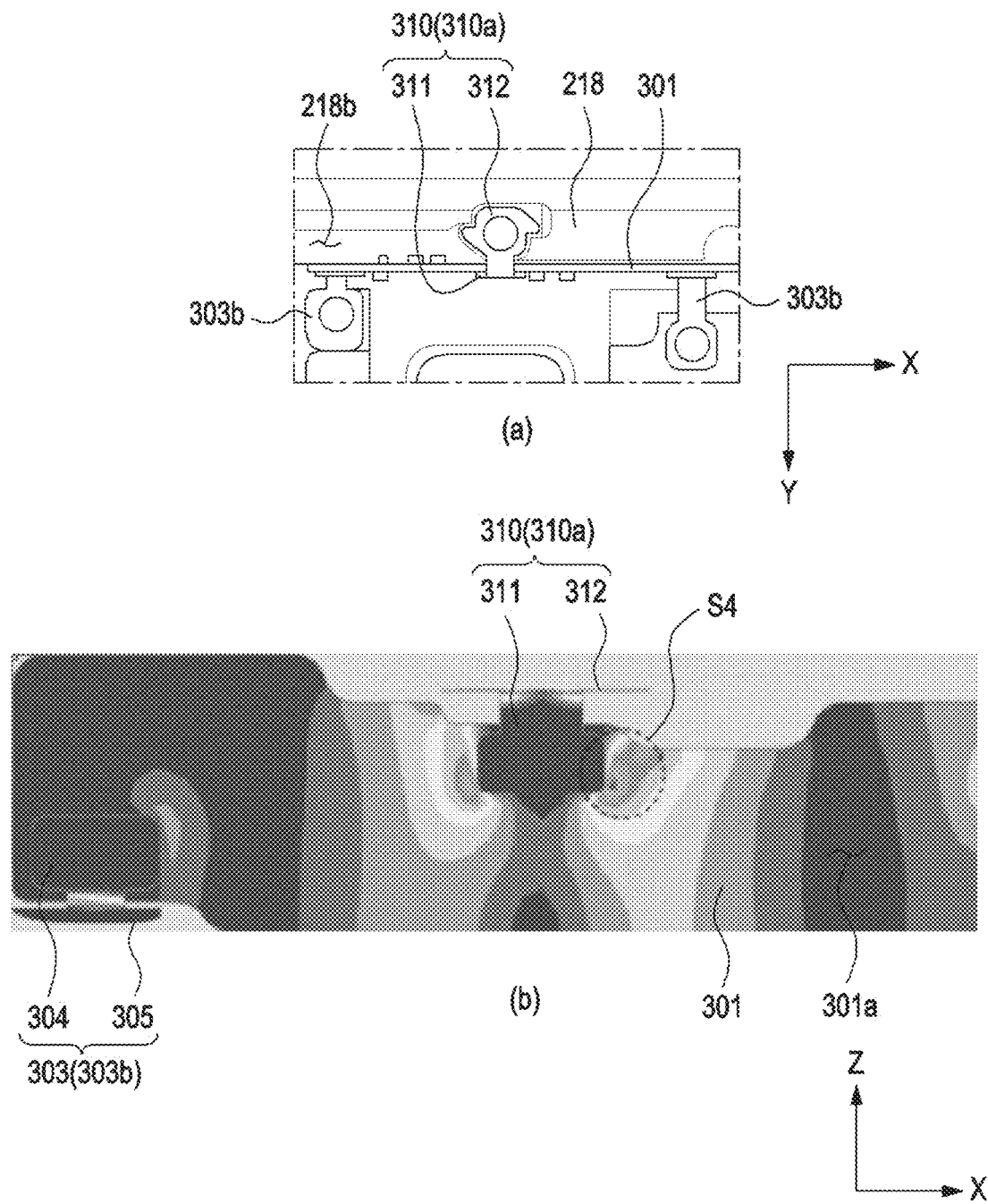
FIG. 14 is a diagram illustrating a simulation result of stress acting on a base plate, when a fixing member is fastened to a wing-type feeding terminal according to an embodiment of the disclosure.

FIG. 14 is a diagram illustrating a simulation result of stress acting on a base plate, when a fixing member is fastened to a wing-type feeding terminal according to an embodiment of the disclosure.

Figure 15:
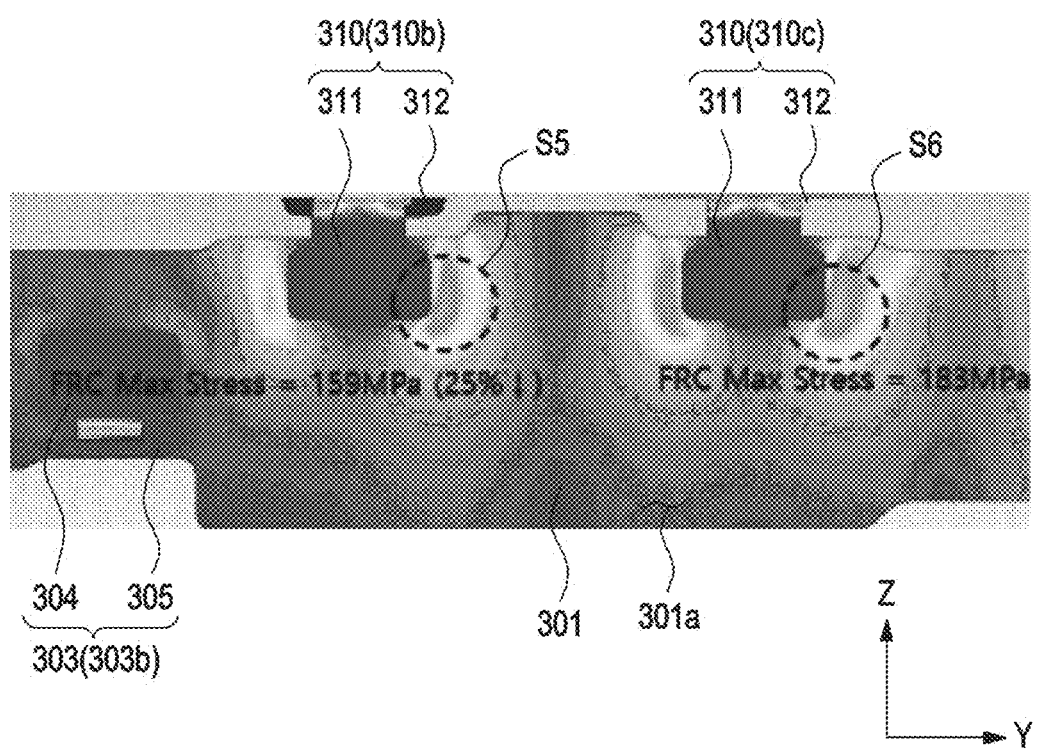
FIG. 15 is a diagram illustrating a simulation result of stress acting on a base plate, when a fixing member is fastened to each of wing-type feeding terminals according to an embodiment of the disclosure.

FIG. 15 is a diagram illustrating a simulation result of stress around wing-type feeding terminals, when fixing members are fastened to wing-type feeding terminals, respectively according to an embodiment of the disclosure.

Part (a) of FIG. 14 may be a top view illustrating the side bezel structure 218 in a state in which a fixing member is fastened to the wing-type feeding terminal 310a, and part (b) of FIG. 14 may be a side view illustrating the side bezel structure 218 in the state in which the fixing member is fastened to the wing-type feeding terminal 310a. FIG. 15 may be a side view illustrating the side bezel structure 218 in a state in which fixing members are fastened to the wing-type feeding terminals 310b and 310c.

FIG. 14 may illustrate a simulation result of stress acting on the base plate 301 to which the wing-type feeding terminal 310a is fastened to implement a first communication scheme (e.g., low band) among a plurality of connecting terminals according to various embodiments of the disclosure. FIG. 14 may illustrate that residual stress of a lower value, for example, 91 MPa than in the embodiment of FIG. 12 exists on the base plate 301 around the wing-type feeding terminal (e.g., in a region S4). It may be noted from the simulation result of FIG. 14 that the residual stress has been reduced by about 18.7%, compared to the embodiment of FIG. 12. FIG. 15 may illustrate a simulation result of stress acting on the base plate 301, when fastening members are fastened to the wing-type feeding terminals 310b and 310c for implementing a second communication scheme (e.g., mid/high band) and a third communication scheme (e.g., UWB) among a plurality of connecting terminals. FIG. 15 may illustrate that residual stress of lower values, for example, 159 MPa and 183 MPa than in the embodiment of FIG. 13 exists around the wing-type feeding terminals 310b and 310c (e.g., in regions S5 and S6). It may be noted from the simulation result of FIG. 15 that the residual stress has been reduced by about 25% and 27%, compared to the embodiment of FIG. 13.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C" may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, logic, logic block, part, or circuitry. A module may be a single integral component, or a minimum unit or part thereof, adapted to perform one or more functions. For example, according to an embodiment, the module may be implemented in a form of an application-specific integrated circuit (ASIC).

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

According to various embodiments of the disclosure, an electronic device (e.g., the electronic device 101 of FIG. 3) may include: a housing (e.g., the housing 210 of FIG. 3) including at least part thereof formed to be a conductive portion; a support member (e.g., the support member 230 of FIG. 3); a PCB (e.g., the PCB 240 of FIG. 3) configured to be disposed on at least one surface of the support member and configured to dispose at least one electronic component thereon; and a connecting member (e.g., the connecting member 300 of FIG. 3) for electrical coupling between the conductive portion of the housing and the electronic component, including a base plate (e.g., the base plate 301 of FIG. 3) and a connecting terminal (e.g., the connecting terminal 303 of FIG. 3). The connecting terminal may include: a first portion (e.g., the first portion 311 of FIG. 9) fixed to the base plate; and a second portion (e.g., the second portion 312 of FIG. 9) coupled to the first portion and including a through hole formed thereon to be fastened to a fixing member, and the second portion may include a wing portion (e.g., the wing portion 313 of FIG. 9) protruding to one direction.

According to various embodiments, the conductive portion of the housing may form at least part of a side bezel structure of the housing.

According to various embodiments, the conductive portion of the housing may be formed as an antenna radiator.

According to various embodiments, at least part of the base plate may be fixed in close contact with an inner surface of the housing.

According to various embodiments, the base plate may be formed of an FPCB.

According to various embodiments, the connecting terminal may include at least one feeding terminal configured to feed the conductive portion of the housing.

According to various embodiments, the connecting terminal may further include a grounding terminal configured to ground the connecting member to the support member.

According to various embodiments, the feeding terminal and the grounding terminal may be disposed to be stepped in a height direction of the electronic device.

According to various embodiments, the first portion and the second portion may be formed to be perpendicular to each other.

According to various embodiments, the first portion of the connecting terminal may face a first surface (e.g., the first surface 218a of FIG. 3) of the side bezel structure of the housing, and the second portion of the connecting terminal faces a second surface (e.g., the second surface 218b of FIG. 3) of the side bezel structure of the housing.

According to various embodiments, the housing may include a wall structure (e.g., the wall structure 218d of FIG. 5) configured to restrict rotation of the wing portion.

According to various embodiments, the second portion may include a pair of wing portions symmetrical to each other with respect to the through hole.

According to various embodiments, the wing portion may protrude along a tightening direction of the fixing member.

According to various embodiments, the electronic device may include an embossed portion on a rear surface of the wing portion.

According to various embodiments, the wing portion may be formed to be bent toward a rear surface.

According to various embodiments of the disclosure, an electronic device may include: a housing including a rear plate facing a first direction (e.g., the Z-axis direction of FIG. 3), a front plate (e.g., the front plate 202 of FIG. 3) facing an opposite direction of the first direction, and a side bezel structure (e.g., the side bezel structure 218) surrounding a space between the front plate and the rear plate (e.g., the rear plate 211 of FIG. 3), and including at least part thereof formed to be a conductive portion; a support member disposed in the space; a PCB configured to be disposed on at least one surface of the support member and configured to dispose at least one electronic component thereon; and a connecting member for electrical coupling between the conductive portion of the housing and the electronic component, including a base plate and a connecting terminal. The connecting terminal may include at least one feeding terminal configured to feed the conductive portion of the housing, and a grounding terminal configured to ground the connecting member to the support member. Each of the feeding terminal and the grounding terminal may include: a first portion fixed to the base plate; and a second portion coupled to the first portion and including a through hole formed thereon to be fastened to a fixing member, and the second portion of the feeding terminal may include a wing portion protruding to one direction.

According to various embodiments, the conductive portion of the housing may be formed as an antenna radiator.

According to various embodiments, the base plate may be formed of an FPCB.

According to various embodiments, the first portions of the connecting terminal may face a first surface of the side bezel structure of the housing, and the second portions of the connecting terminal may face a second surface of the side bezel structure of the housing.

According to various embodiments, the housing may include a wall structure configured to restrict rotation of the wing portion.

According to various embodiments, at least part of the wall structure is formed to correspond to a shape of the wing portion.

According to various embodiments, the wall structure includes a stepped portion, and the stepped portion is formed in a shape corresponding to the wing portion.

According to various embodiments, the wing portion is formed as a flange portion protruding, and the flange portion is formed as a catching portion, in a shape of a hook, extending from the second portion in a tightening direction of the fixing member and then extending vertically toward a center of the through hole.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:
1. An electronic device comprising:
a housing including at least part thereof formed to be a conductive portion;
a support member;
a printed circuit board configured to be disposed on at least one surface of the support member and configured to dispose at least one electronic component thereon; and
a connecting member for electrical coupling between the conductive portion of the housing and the electronic component, the connecting member including a base plate and a connecting terminal, wherein the connecting terminal includes:
a first portion fixed to the base plate, and
a second portion coupled to the first portion and including a through hole formed thereon to be fastened to a fixing member, and
wherein the second portion includes a wing portion protruding to one direction.

2. The electronic device of claim 1, wherein the conductive portion of the housing forms at least part of a side bezel structure of the housing.

3. The electronic device according to claim 1, wherein the conductive portion of the housing is formed as an antenna radiator.

4. The electronic device of claim 1, wherein the base plate is formed of a flexible printed circuit board (FPCB).

5. The electronic device of claim 1, wherein at least part of the base plate is fixed in close contact with an inner surface of the housing.

6. The electronic device according to claim 1, wherein the connecting terminal further includes at least one feeding terminal configured to feed the conductive portion of the housing.

7. The electronic device of claim 6, wherein the connecting terminal further includes a grounding terminal configured to ground the connecting member to the support member.

8. The electronic device of claim 7, wherein the feeding terminal and the grounding terminal are disposed to be stepped in a height direction of the electronic device.

9. The electronic device of claim 1, wherein the first portion and the second portion are formed to be perpendicular to each other.

10. The electronic device of claim 1,
wherein the first portion of the connecting terminal faces a first surface of a side bezel structure of the housing, and
wherein the second portion of the connecting terminal faces a second surface of the side bezel structure of the housing.

11. The electronic device of claim 1, wherein the housing includes a wall structure configured to restrict rotation of the wing portion.

12. The electronic device of claim 1, wherein the second portion includes a pair of wing portions symmetrical to each other with respect to the through hole.

13. The electronic device of claim 1, wherein the wing portion protrudes along a tightening direction of the fixing member.

14. The electronic device of claim 1, further comprising an embossed portion on a rear surface of the wing portion.

15. The electronic device of claim 1, wherein the wing portion is formed to be bent toward a rear surface.

16. An electronic device comprising:
a housing including a rear plate facing a first direction, a front plate facing an opposite direction of the first direction, and a side bezel structure surrounding a space between the front plate and the rear plate, wherein at least part of the housing is formed to be a conductive portion;
a support member disposed in the space;
a printed circuit board configured to be disposed on at least one surface of the support member and further configured to dispose at least one electronic component thereon; and
a connecting member for electrical coupling between the conductive portion of the housing and the electronic component, the connecting member including a base plate and a connecting terminal,
wherein the connecting terminal includes:
at least one feeding terminal configured to feed the conductive portion of the housing, and
a grounding terminal configured to ground the connecting member to the support member,
wherein each of the feeding terminal and the grounding terminal includes:
a first portion fixed to the base plate, and
a second portion coupled to the first portion and including a through hole formed thereon to be fastened to a fixing member, and
wherein the second portion of the feeding terminal includes a wing portion protruding to one direction.

17. The electronic device of claim 16, wherein the conductive portion of the housing is formed as an antenna radiator.

18. The electronic device of claim 16, wherein the base plate is formed of a flexible printed circuit board (FPCB).

19. The electronic device of claim 16,
wherein the first portion of the connecting terminal face a first surface of the side bezel structure of the housing, and
wherein the second portion of the connecting terminal face a second surface of the side bezel structure of the housing.

20. The electronic device of claim 16, wherein the housing includes a wall structure configured to restrict rotation of the wing portion.

* * * * *